(12) United States Patent
Cheng et al.

(10) Patent No.: US 8,642,880 B2
(45) Date of Patent: Feb. 4, 2014

(54) INTERCHANGEABLE AND FULLY ADJUSTABLE SOLAR THERMAL-PHOTOVOLTAIC CONCENTRATOR SYSTEMS

(76) Inventors: Chia-Chin Cheng, Tainan (TW); John W. Holmes, Tainan (TW)

( * ) Notice: Subject to any disclaimer, the term of this patent is extended or adjusted under 35 U.S.C. 154(b) by 0 days.

(21) Appl. No.: 13/488,825

(22) Filed: Jun. 5, 2012

(65) Prior Publication Data

US 2013/0008487 A1    Jan. 10, 2013

Related U.S. Application Data

(60) Provisional application No. 61/505,149, filed on Jul. 7, 2011.

(51) Int. Cl.
*H01L 31/052* (2006.01)
*H01L 31/058* (2006.01)

(52) U.S. Cl.
USPC .............................. 136/248; 136/206; 136/246

(58) Field of Classification Search
None
See application file for complete search history.

(56) References Cited

U.S. PATENT DOCUMENTS

| | | | | |
|---|---|---|---|---|
| 4,377,154 A | * | 3/1983 | Meckler | 126/603 |
| 4,427,838 A | * | 1/1984 | Goldman | 136/248 |
| 5,089,055 A | * | 2/1992 | Nakamura | 136/248 |
| 5,374,317 A | * | 12/1994 | Lamb et al. | 136/246 |

* cited by examiner

*Primary Examiner* — Jennifer Michener
*Assistant Examiner* — Matthew Zapadka
(74) *Attorney, Agent, or Firm* — Muncy, Geissler, Olds & Lowe, PLLC

(57) ABSTRACT

An interchangeable and fully adjustable solar thermal-photovoltaic concentrator system is provided, comprising: one or more heat collecting elements; one or more primary reflectors having one or more openings; one or more sunray directing optical mechanisms at the sun-collecting side of primary reflectors and between the heat collecting elements and openings in the primary reflectors; one or more PV cell modules disposed at the non-sun-collecting side of the primary reflectors; and one or more sunray distributing optical mechanisms disposed at the non-sun-collecting side of the primary reflectors. Wherein after sunrays irradiate to the primary reflectors, a proportion of sunrays ranging from 0% to 100% are reflected to one or more heat collecting elements and the remaining sunrays are directed by the sunray directing optical mechanisms, through openings in the primary reflectors, and distributed by the sunray distributing optical mechanisms to one or more PV cell modules.

30 Claims, 21 Drawing Sheets

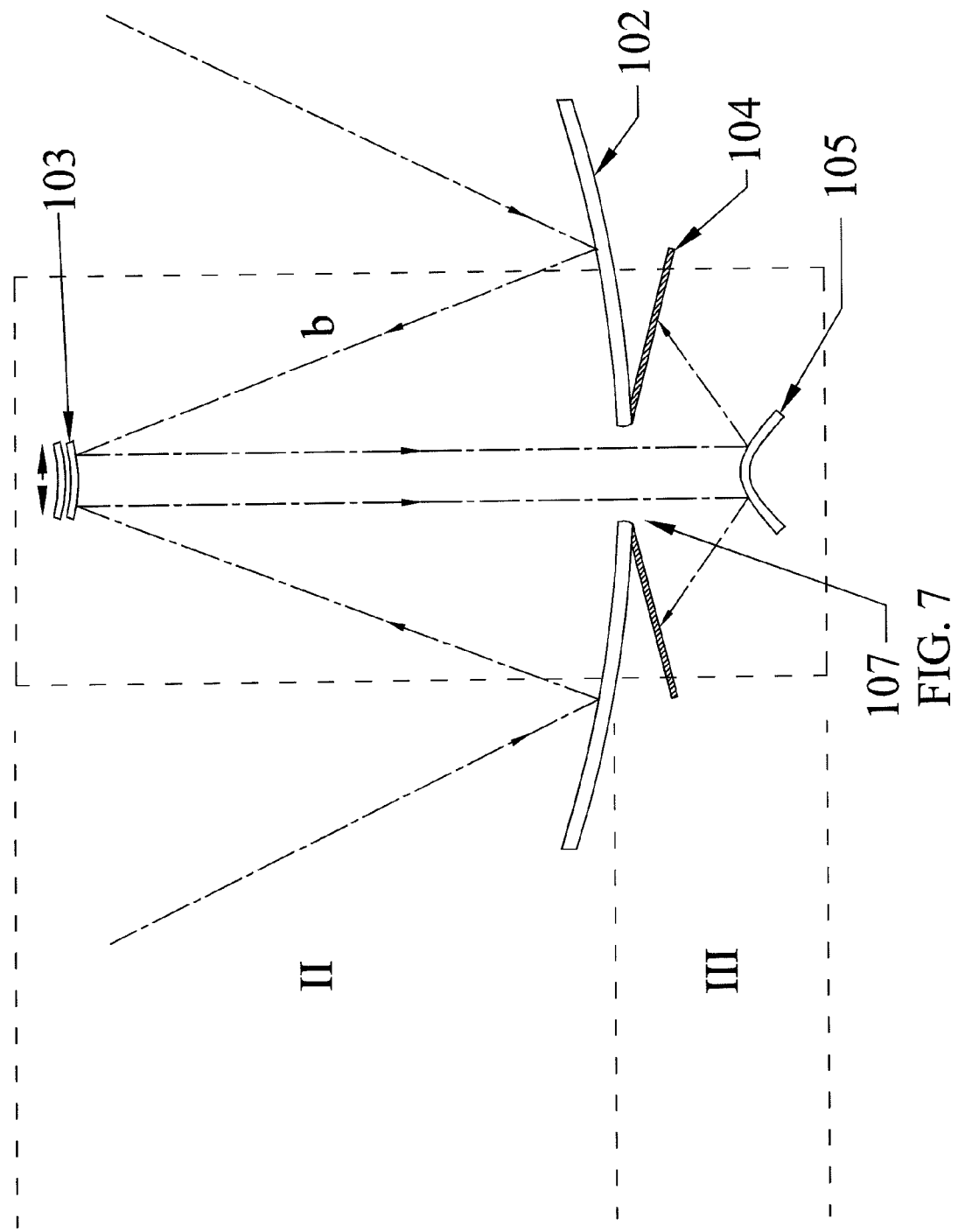

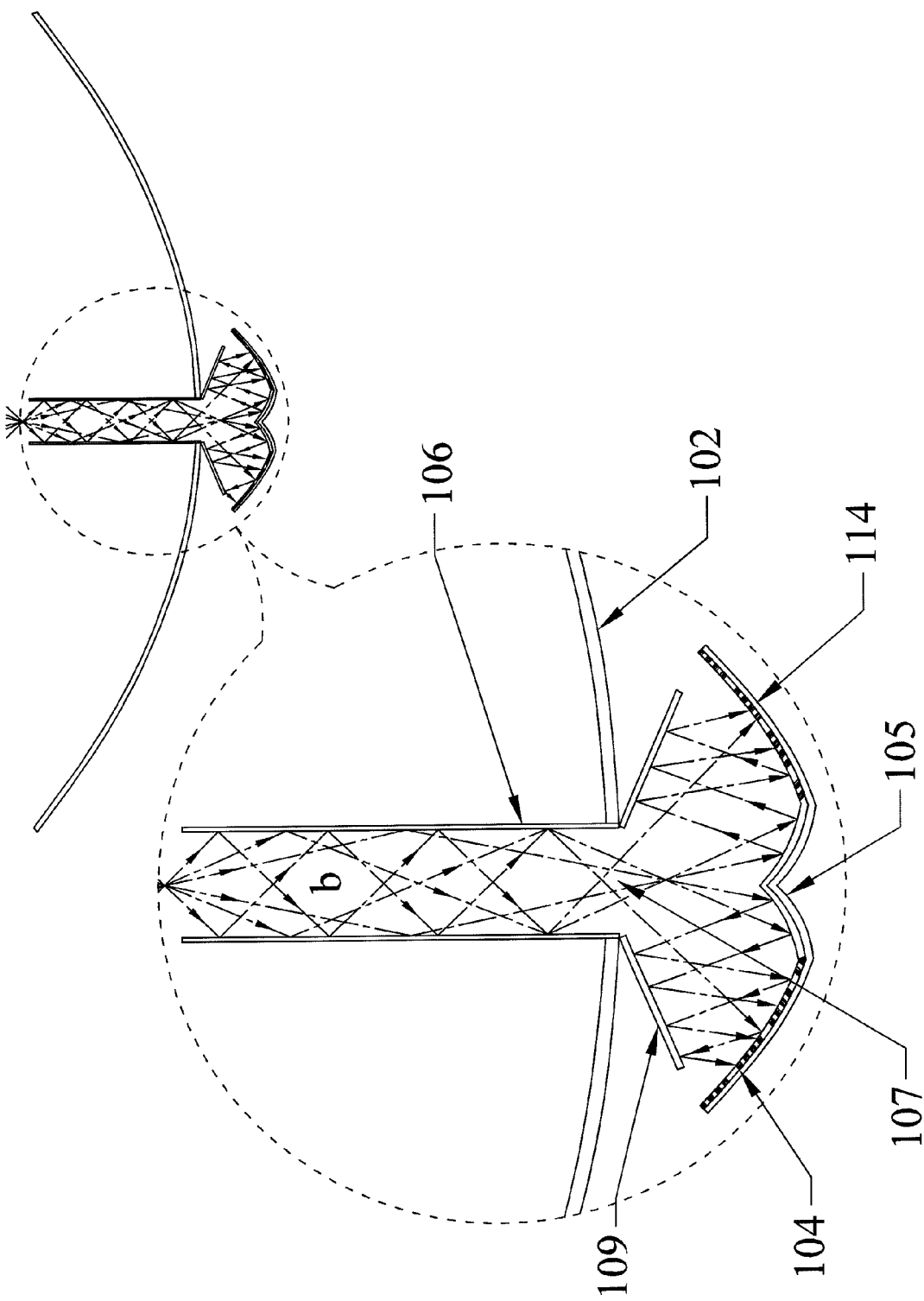

INTERCHANGEABLE AND FULLY ADJUSTABLE SOLAR THERMAL-PHOTOVOLTAIC CONCENTRATOR SYSTEMS

CROSS-REFERENCE TO RELATED APPLICATION

This application claims the benefit of U.S. Provisional Application No. 61/505,149, filed on Jul. 7, 2011, in the US. Patent and Trademark Office the disclosure of which is incorporated herein by reference.

BACKGROUND OF THE INVENTION

1. Field of the Invention

The present invention generally relates to a combined solar thermal-photovoltaic concentrator system, in particular to an interchangeable and fully adjustable concentrated solar thermal and photovoltaic system.

2. Description of the Related Art

Using point-focus or linear-focus reflectors with sun-tracking ability to concentrate solar energy and provide higher energy output has been widely applied in the solar photovoltaic (PV) industry for electricity production and in the solar thermal industry for thermal energy and electricity production. Some technologies also combine PV and thermal energy production to provide both heat and PV electricity simultaneously. Conventional combined concentrated solar technology often places both PV cells and thermal receivers on or near the focus point (or focal line) of the concentrating reflectors. A typical configuration of such combined solar receiver includes PV cells placed on the focal line of a parabolic solar concentrator and a thermal collecting unit placed directly on the non-solar collecting side of the PV cells to take away residual heat from the PV cells and recycle the thermal energy. In this type of configuration, the thermal units are mainly designed to take away extra heat from PV cells; therefore, such system is not suitable for high-temperature applications. This is due to the specific temperature requirement of PV cell operation. PV cells are most efficient at lower temperature. The efficiency of PV cells goes down significantly when the temperature of a PV cell reaches approximately 70° C. and above. Moreover, the life of PV cells is drastically shortened in long-term elevated temperature operation. On the other hand, solar thermal energy is most applicable and efficient at high temperature. For example, to achieve higher efficiency, solar thermal absorption chillers which utilize heat energy to produce chilled water typically require a working fluid temperature above 100° C. Direct thermal use for industrial applications typically requires a fluid temperature above 70° C., and 100° C. or higher for steam generation. For electric power generation, the working fluid temperature requirement is typically 300° C. to 450° C. to drive steam turbines and 600° C. and above to achieve high thermodynamic efficiency in current generation Stirling engines. For high-temperature thermal applications, available solar thermal units typically cannot be combined with PV cells to take advantage of the additional electricity production benefits. The conflicting temperature requirements of solar thermal energy and solar PV technology limit the development of integrated solar PV and thermal energy utilization.

In terms of geometry of PV cell placement, conventional PV receivers in a typical thermal-photovoltaic concentrator system are placed on the sun-collecting side of the primary concentrator (reflector). This configuration limits the geometry and the number of PV cells that can be placed on the sun-collecting side. Moreover, for typical low-cost single-crystalline and polycrystalline PV cells, high concentration ratios provide only marginal efficiency benefit because of the increase in PV cell temperature and minimal efficiency improvement at high concentration ratios. For typical PV cells, lower concentrating ratios (below 10× sun for single-crystalline and polycrystalline PV cells) provide a higher efficiency and energy output benefit. This limitation in concentration ratio conflicts with the requirement of a thermal concentrator which typically utilize 20× and above for linear concentrators and much higher concentration ratios to achieve higher temperatures in dish type concentrators.

Combined solar thermal and electrical energy is a very efficient, diversified and desirable form of solar energy utilization, especially in areas where usable land resources are limited. Compared to the use of solar energy to produce electrical energy, using solar energy to produce thermal energy is more efficient (typically 60-80% efficiency for thermal production vs. 15-30% for electricity production). Although the direct use of solar thermal energy is most efficient, electricity is often required by most end-users because of its diverse end-use. There are many limitations in the simultaneous production of thermal and electrical energy; these limitations arise from the technical availability and suitable capacity application for various commercially available thermal-to-electric power generators. For example, large solar thermal power plants (20 MW to several hundred MW) that utilize steam turbines connected to electric generators require a large land area to harvest solar energy and are usually located in remote locations. These large plants typically do not provide simultaneous heat energy to end-users as it is not economical to transport heated fluids over long distances. For small-capacity power generation, for example, Stirling engines combined with parabolic dish solar collectors, the cost can be prohibitive and these systems generally do not produce heat simultaneously. Other small-capacity systems using heat engines, such as organic Rankine cycle (ORC) heat engines combined with linear parabolic troughs, typically have low thermal-to-electric efficiency. When land size is limited for solar energy production, for example, in the vicinity of cities or on the rooftop of a commercial or residential site, a system that combines PV electric power generation with solar thermal energy offers a flexible capacity, diversified end-use, energy efficient and cost-effective option for combined thermal and electrical energy production. Such a system should allow the end user to adjust the relative electric or thermal energy output depending upon the particular end use. If the solar industry can provide combined electrical and thermal energy with low cost, high efficiency and high temperatures, with a capacity range in the kilo-watt to several megawatt levels or higher, combined thermal-electric solar energy systems have a very large potential market. This market includes distributed energy for industrial, residential and commercial applications, as well as large-scale combined energy plants. A dual-use concentrated thermal and PV electricity combined system fills this technical and capacity gap.

SUMMARY OF THE INVENTION

A primary objective of the present invention is to provide a dual-use concentrated solar thermal-photovoltaic system, which is capable of generating solar thermal energy and photovoltaic electricity interchangeably and is fully adjustable to provide thermal energy and photovoltaic electricity in any proportion. The present invention also discloses methods to optimize both solar thermal production and PV electricity generations by separating the thermal elements and PV cell modules in different locations of a solar concentrator and distributing the solar radiation in any proportion between the thermal and PV elements using the same concentrator. By using the same structure for both solar PV and solar thermal energy production, the present invention makes better use of limited space and allows diversified use of solar energy. The combined technology also allows for lower costs since components used for PV energy production and for solar thermal energy can be configured to use the same frame and tracking system. Moreover, because of its modular design, the present invention can provide electrical power in the kilo-watt to megawatt electricity range, in combination with thermal energy. Large-scale combined thermal-electricity production is also possible depending on end-user requirements and availability of land resources.

To achieve the foregoing objectives, aspects of the present invention combine solar PV with concentrated solar thermal energy using concentrating parabolic, quasi-parabolic, linear, curved or Fresnel reflectors to maximize and optimize solar energy production, provide dual (or multiple) uses for solar energy, increase land-use efficiency, and lower the cost of solar energy.

However, aspects of the present invention are not restricted to the ones set forth herein. The above and other aspects of the present invention will become more apparent in the detailed description of the present invention given below.

According to an aspect of the present invention, there is provided an interchangeable and fully adjustable solar thermal-photovoltaic concentrator system, comprising: a heat collecting element; a primary reflector (or a primary reflector set) having a sun-collecting side (reflecting side or sun-facing side) facing the heat collecting element and having an opening (or multiple openings); a secondary reflector disposed at the sun-collecting side of the primary reflector(s) and between the heat collecting element and the opening(s) with the reflective side facing the reflected sunrays by the primary reflector (or the openings), a sunray directing optical mechanism disposed between the secondary reflector and the opening(s); photovoltaic (PV) cell module(s) disposed at a non-sun-collecting side (or non-reflecting side or back side) of the primary reflector; a tertiary reflector disposed at the non-sun-collecting side of the primary reflector and positioned at a predetermined configuration and distance from the opening(s); and a sunray distribution optical mechanism disposed at the non-sun-collecting side of the primary reflector to distribute the concentrated sunrays directed to the non-sun-collecting side of the primary reflector(s) onto the PV cell module(s).

In a preferred embodiment of the present invention, after sunrays irradiate to and are reflected from the primary reflector, a portion of the concentrated sunrays, ranging from 0%~100%, may be intercepted and directed by the secondary reflector(s) (and the corresponding sunray directing optical mechanism) through the opening and distributed by the tertiary reflector (and the corresponding sunray distributing optical mechanism) onto the PV cell module(s), the remaining portion of the sunrays reflected from the primary reflector may continue to travel and reach the heat collecting element.

In a preferred embodiment of the present invention, the secondary reflector, as a main component of the sunray directing optical mechanism, may comprise one or more linear reflectors. In this embodiment, the distance between secondary reflector(s) and the heat collecting element(s) and, therefore, the distance between the secondary reflector(s) and the opening(s) on the primary reflector(s) may be fixed or adjustable by a height adjusting mechanical apparatus to control the proportion of concentrated sunrays reflected down through the opening(s) in the primary reflector(s).

In another embodiment of the present invention, the secondary reflector(s) may be one or more convex reflectors or other suitably shaped reflector geometry capable of reflecting and redirecting sunlight through the opening(s) in the primary reflector(s). In this embodiment, the convex reflector(s) or other suitably shaped reflector geometry may be width adjustable to control the proportion of concentrated sunrays directed down through the opening(s).

Preferably, for the embodiment of linear focus reflectors, the present invention may further comprise a light tunnel as part of the sunray directing optical mechanism, located between the secondary reflector and the opening(s) of the primary reflector(s) and extending parallel to the focal line of the primary reflector(s) and formed by a plurality of linear or curved reflectors facing each other. The light tunnel is used to confined and channel the proportion of sunrays which has been reflected and redirected by the secondary reflector to and through the primary reflector opening(s). The height, length and cross section of the one or more light tunnels may be fixed or adjustable, along with the height adjustment of the secondary reflector(s), for example, by using suitable mechanisms such as retractable reflectors, collapsible segmented reflectors, reflectors with flexible rolling mechanism, linearly traveling reflectors or other suitable mechanisms. The light tunnel may be supported by structural components and controlled by a height, length and cross section adjusting mechanical apparatus.

Preferably, for the embodiment of point focus reflectors, the present invention may comprise a light tube with a reflecting surface along an inner wall and extending along the focal axis direction of the primary reflectors and disposed between the secondary reflectors and the openings to confined and channel the proportion of sunrays which has been reflected and redirected by the secondary reflector to and through the primary reflector opening(s). The height, length and cross section of one or more light tubes may be fixed or adjustable, along with the height adjustment of the secondary reflector(s), for example, by using suitable mechanisms such as retractable reflectors, collapsible segmented reflectors, linearly sliding reflectors, flexible reflectors or other suitable mechanisms. The light tube may be supported by structural components and controlled by a height adjusting mechanical apparatus.

Preferably, the present invention may further comprise one or more concave lenses disposed at the sun-collecting side of the primary reflector(s) and between the secondary reflector(s) and the opening(s), as one embodiment of the sunray directing optical mechanism. In this embodiment, the distance between the opening(s) in the primary reflector(s) and the concave lens(es) is fixed or adjustable, along with the secondary reflector(s), and supported by structural components and controlled by a height adjusting mechanical apparatus.

In the preferred embodiments of the present invention, the heat collecting element comprises one or more heat receiver tubes, one or more heat absorption devices or one or more heat engines or a combination thereof.

In one embodiment of the present invention, the sunray distributing optical mechanism comprises one or more tertiary reflectors disposed at a predetermined distance from the openings of the primary reflectors on the non-sun-collecting side, with the reflective surface facing the concentrated sunrays directed through the openings.

Preferably, the tertiary reflectors are a linear reflector set, a convex reflector, a convex reflector set, a concave reflector, a concave reflector set, a curved reflector, a curved reflector set, or a combination thereof.

The present invention further comprises one or more extension reflectors disposed below the primary reflectors near the opening (on the non-sun-collecting side), attached to parts of the primary reflectors, connected to the tertiary reflectors or PV cell modules, or used for placement of the PV cell modules.

The present invention may further include various embodiments of open or closed structures with different tertiary reflector(s), PV cell modules and other extended reflector placements located on the non-sun-collecting side of the primary reflector(s), as various embodiment of the sunray distributing optical mechanism, to achieve a desired intensity and uniform distribution of solar radiation on the PV cells.

The various placements of the tertiary reflector(s), PV cell modules and extended reflectors to form various embodiments of open or closed structures of the back-side sunray distribution optical mechanism can increase the absorption of solar radiation by the PV cells by containing and allowing multiple reflections of the radiation by the tertiary reflector(s) and extended reflects until eventually absorbed by the PV cells.

Preferably, the present invention may further comprise one or more main structural component of the primary reflector located near the opening(s) and the tertiary reflector(s).

Preferably, the present invention may further comprise a plurality of structural frame components (such as stiffeners or ribs) which support the primary reflector on the sun collecting or non-sun-collecting side.

Preferably, the present invention may further comprise a plurality of structural frame components (such as stiffeners or ribs) utilized for attachment of assemblies or components of the sunray directing optical mechanism.

In another embodiment of the present invention, the PV cell module(s) may be attached to structural frame components on the non-sun-collecting side of the primary reflector(s).

Preferably, the present invention may further comprise a plurality of reflectors attached to structural components or their extensions respectively on the non-sun-collecting side of the primary reflector(s).

In another embodiment of the present invention, the PV cell modules may be disposed on the non-sun-collecting side of the primary reflector(s), and attached to the primary or tertiary reflector(s) or structural components supporting the primary reflector or any structural extensions.

In the various embodiments of the present invention that are described above, the PV cell modules are disposed on the non-sun-collecting side of the primary reflectors such that in normal operation the PV cell modules are able to partially be protected from dust or water and can be further protected by protective enclosures around the modules or the tertiary reflectors and their extensions around the PV cell modules.

In another embodiment of the present invention, the PV cell modules may be disposed on the non-sun-collecting side of the primary reflector(s), and attached to the ground or to any structure placed on the ground or on a pedestal affixed to the ground. Hereinafter, the term "ground" is taken to include a any location under or adjacent to the primary reflector and includes, but is not limited to other surfaces such as ship decks, piers, building roofs or walls, suspended cables, bridge decks and offshore structures.

In a preferred embodiment of the present invention, the primary reflector(s) include flat, Fresnel, curved, parabolic or quasi-parabolic shapes, or combinations of these geometries that can focus sunrays.

In one embodiment of the present invention, the primary reflector(s) may be adjustable and arranged to provide a first focal point and a second focal point.

In one embodiment of the present invention, the heat collecting element may be disposed at the first focal point and all or a portion of the sunrays concentrated to the second focal point may be directed down through the opening(s) by a sunray directing optical mechanism.

In other embodiments of the present invention, the primary reflector(s) may be adjustable and may have a plurality of focal points.

In a preferred embodiment of the present invention, the heat collecting element is a receiver tube, a heat absorbing device or a heat engine.

In a preferred embodiment, a heat dissipating mechanism, such as a heat sink, heat pipes, fans or heat transfer fluid, can be disposed on the sun-collecting or non-sun-collecting side of the primary reflector(s) or attached to any structural components to reduce the temperature of the PV cells or to capture and use heat from the PV cells.

In a preferred embodiment, the primary, secondary or tertiary reflector(s), their extended structure, or the frame of the light tunnel can also be used as a heat sink for the PV cells or modules, having the advantage of a large thermal mass and convection cooling to further dissipate heat from attached PV cells or cell modules. The supporting structure(s) of the solar reflector system can also be used as a heat sink.

The present invention further comprises one or a plurality of heat conducting mechanisms to utilize the primary reflector or any structural and extended structural components of the concentrator system as the heat sink to reduce temperature of PV cells In a preferred embodiment, the PV cells can be polycrystalline, single-crystalline, multi-junction, thin film or other solar PV types, or combinations of multiple PV cell types.

Preferably, the present invention may further include a control system that adjusts the height or the size of one or more optical components of the sunray directing optical mechanism which may include secondary reflectors, a light tube, a light tunnel, or optical lenses to change the proportion of the concentrated sunray directed to non-sun-facing side of the primary reflector(s) onto the PV cells.

Preferably, the present invention may further include a mechanism and a control system that allows the primary reflector(s) to track the sun.

The interchangeable and fully adjustable solar thermal-photovoltaic system according to the present invention has the following advantages:

(1) Enable separately meeting specific temperature and concentration requirements of both the heat collecting element and PV cells to optimize efficiency, energy output and applications for the combined PV and solar thermal systems.

(2) By separating the heat collecting element and the PV cells, the solar thermal receiver can be operated at a higher temperature than the PV cells (e.g. above 70° C.) and the PV cells can be cooled (e.g., by a heat sink if needed) to a lower temperature (below 70° C.) to optimize the efficiency.

(3) By using the non-sun-collecting side of the primary reflector, the system allows flexible design of the exposed area of the PV cells or cell modules and of the attachment layout to reach the optimal sun intensity or concentration ratio (commonly called n× sun in the PV industry) for various types of PV cells or combinations of PV cell types (e.g., poly-crystalline, single-crystalline, or multi-junction, or thin film PVs).

(4) By placing the PV cells on the non-sun-collecting side, and by enclosing in a closed structure in some preferred embodiments, the PV cells and the electronics are protected from dust, water and other environmental pollutants in operating positions.

(5) Dual use (switchable) technology that can be optimized to take advantage of available solar energy and land resources and to provide flexibility in energy utilization such as primarily solar thermal energy, primarily electric power from PV cells or a portion of energy from each source.

(6) By adjusting the proportions of the concentrated sunrays directed to the heat collecting element and the PV cells, there is unlimited degree of freedom to make use and adjust the output of solar thermal and electrical energy depending on ever-changing end-user's requirements and demand conditions. The proportion of solar energy can also be adjusted to maximize the efficiency of the PV cells or the thermal energy required by a particular application such as an absorption chiller.

(7) Improved efficient utilization and diversified use of space for solar energy. Reduced cost of integrated solar thermal and solar power generation. Enable solar powered-small capacity (sub-megawatt to several megawatts) combined thermal, cooling and electricity supply for small industry, residential and commercial use.

(8) Modulized design to enable application for large-capacity combined energy plants.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein:

FIG. 7 is another modified embodiment from FIGS. 5A-5C in which a third variation of a sunray directing optical mechanism consisting of a convex reflector set, as well as a typical embodiment of a sunray distributing optical mechanism are shown;

FIGS. 10A-10C are schematic views of the third variation for the design of the sunray distributing optical mechanism positioned at the non-sun-collecting side of the primary reflector(s), in which another exemplary embodiment of open-structural designs are shown;

Figure 1A:
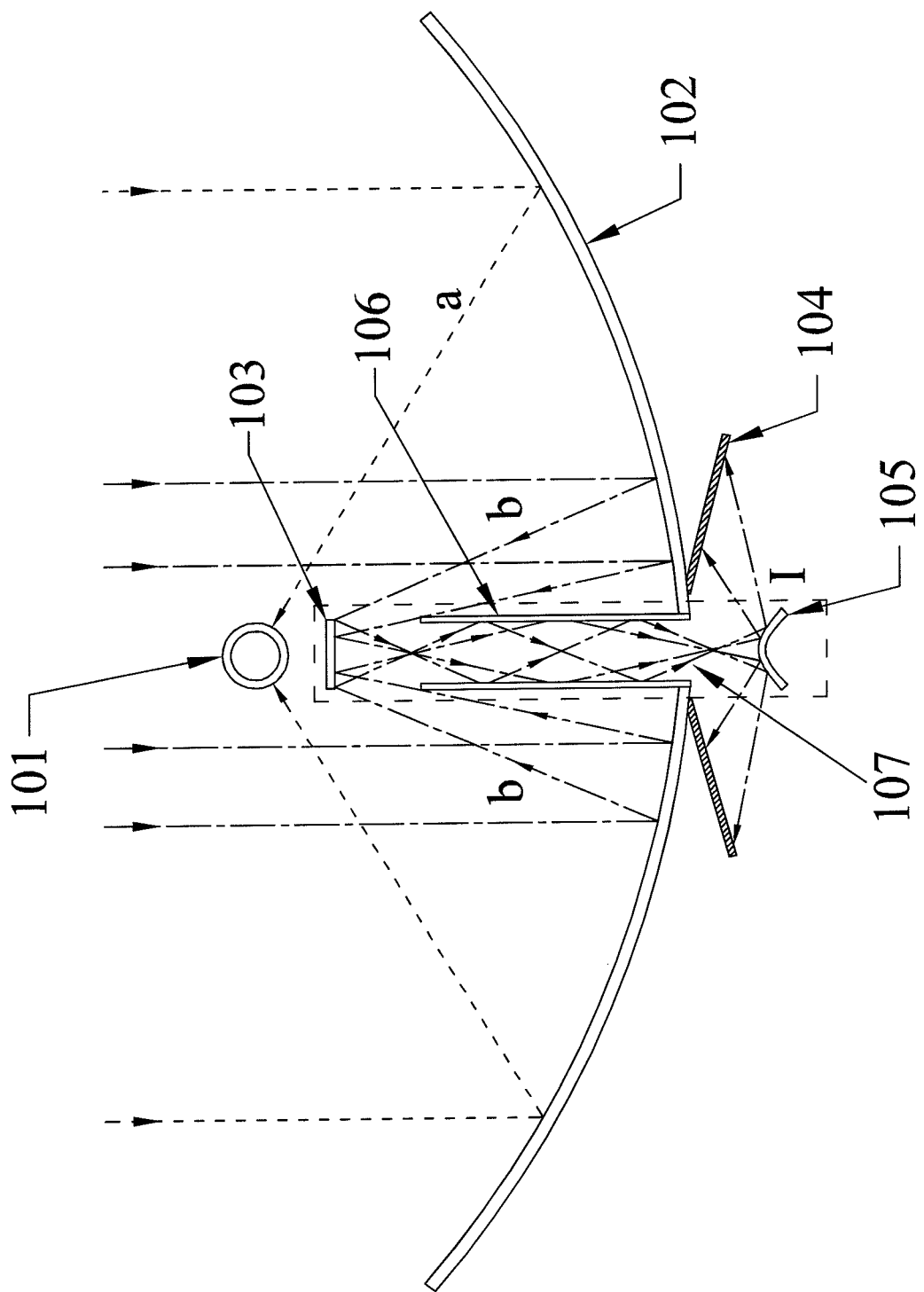
FIG. 1A is a cross sectional view of a primary linear (or point-focus) parabolic concentrator with a sunray directing optical mechanism and a sunray distributing optical mechanism that direct and distribute sunlight to the non-sun-collecting side of the primary reflector.

DESCRIPTION OF THE REFERENCE SYMBOLS 101 heat collecting element
102 primary reflector
103 secondary reflector
104 photovoltaic cell module
105 tertiary reflector
106 light tunnel
107 opening of the primary reflector
108 concave lens
109 extension reflector
110 central structural component
111 supporting structural component
112 reflector
113 linear actuator 114 extension reflectors of tertiary reflectors (tertiary reflector extensions)
115 light tunnel retracting mechanism
I adjustable sunray redistributing optical mechanism
II sunray directing optical mechanism
III sunray distributing optical mechanism
f1 first focal point
f2 second focal point
a sunrays reflected to the heating element
b sunrays reflected to the secondary reflector and redirected by sunray directing mechanism

DETAILED DESCRIPTION OF THE PREFERRED EMBODIMENTS

Advantages and features of the present invention and methods of accomplishing the same may be understood more readily by reference to the following detailed description of exemplary embodiments and the accompanying drawings. The present invention may, however, be embodied in many different forms and should not be construed as being limited to the embodiments set forth herein. Rather, these embodiments are provided so that this disclosure will be thorough and complete and will fully convey the concept of the invention to those skilled in the art, and the present invention will only be defined by the appended claims. In the drawings, sizes and relative sizes of layers and regions may be exaggerated for clarity.

Embodiments of the invention are described herein with reference to cross-sectional illustrations that are schematic illustrations of idealized embodiments of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from design variations, or from manufacturing. Thus, the regions illustrated in the figures are schematic in nature and their shapes are not intended to illustrate the actual shape of a region of a device and are not intended to limit the scope of the invention.

Hereinafter, exemplary embodiments of the present invention will be described in further detail with reference to the accompanying drawings.

Referring to FIG. 1A, FIG. 1A is a cross sectional view of a primary linear (or point-focus) parabolic concentrator with a sunray directing optical mechanism and a sunray distributing optical mechanism that direct and distribute sunlight to the non-sun-collecting side of the primary reflector(s). The interchangeable and fully adjustable solar thermal-photovoltaic concentrator system according to the exemplary embodiment of the present invention includes: heat collecting element(s) 101, primary reflector(s) 102, secondary reflector(s) 103, photovoltaic (PV) cell module(s) 104, tertiary reflector(s) 105, and a light tunnel 106. Region I is an adjustable sunray redistributing optical mechanism that shows a combination of a sunray directing optical mechanism located on the sun-collecting side of the primary reflector(s) 102, and a sunray distributing optical mechanism located on the non-sun-collecting side of the primary reflector(s) 102, which will be described herein.

As described above, the primary reflector(s) 102 includes a sun-collecting surface facing the heat collecting element(s) 101 and has an opening(s) 107; the secondary reflector(s) 103 being disposed at the sun-collecting side of the primary reflector(s) 102 and between the heat collecting element 101 and the opening(s) 107 on the bottom of the primary reflector(s) 102; PV cell module(s) 104 disposed at the non-sun-collecting side of the primary reflector(s) 102; and the tertiary reflector(s) 105 disposed at the non-sun-collecting side of the primary reflector(s) 102 and positioned at a predetermined distance from the opening(s) 107. In addition, light tunnel(s) 106, as part of the sunray directing optical mechanism, is extended parallel to the focal line of the primary reflector(s) 107 and is formed by a plurality of linear or curved reflectors facing each other. Furthermore, the tertiary reflector(s) 105 may have linear, curved, triangular, arc, or other suitable shapes including those shown in FIG. 1B.

In this preferred embodiment, after sunrays irradiate to the primary reflector(s) 102, a portion of the sunrays reflected from the primary reflector(s), ranging from 0%~100%, irradiate to the heat collecting element(s) 101 (see lines "a" in FIG. 1A) and the remainder of the sunrays are directed to the PV cell module(s) 104 through the second reflector(s) 103, the light tunnel(s) 106, and the tertiary reflector(s) 105 (see lines "b" in FIG. 1A).

Referring to FIG. 1A, the sun-collecting side of the primary reflector(s) 102, such as a linear-focus (or point focus) parabolic reflector, is used to focus solar energy onto a heat collecting element(s) 101 disposed at or near the focus to collect thermal energy and simultaneously a portion or all of the concentrated sunlight can be intercepted and directed to the non-sun-collecting side of the primary reflector(s) 102 (shown as sunrays "b" in FIG. A), depending on the position of the secondary reflector(s) 102 and the light tunnel(s) 106. A portion or all of the concentrated sunlight (sunrays "b") can be intercepted from the sun-collecting side and redirected to the non-sun-collecting side of the primary reflector(s) 102 through the opening(s) 107 by a sunray directing optical mechanism including the secondary reflector(s) 103 and light tunnel(s) 106. The concentrated sunrays exiting through opening(s) 107 are then redistributed by the tertiary reflector(s) 105 onto PV cell module(s) 104 attached to the non-sun-collecting side of the primary reflector(s) 102. PV cell module(s) 104 being directly attached to the non-sun-collecting side of the primary reflector(s) 102 or attached to an extended structure as shown in FIG. 1A to generate electricity. The proportion of the sunrays (sunrays "b") intercepted and redirected to the non-sun-collecting side of the primary reflector(s) 102 is controlled by changing the distance between the secondary reflector(s) 103 and the opening(s) 107, as well as the height of the light tunnel(s) 106. When the secondary reflector(s) 103 are placed at or near the focus of the primary reflectors 102(s) (and the heat collecting element(s) 101) and the height of the light tunnel(s) 106 are adjusted accordingly to contain the sunrays, 100% or close to 100% of the concentrated sunrays reflected by the primary reflector(s) (sunrays "b") are intercepted and redirected to the non-sun-collecting side of the primary reflector(s) 102 through the light tunnel and exit the opening(s) and are then distributed to the PV cells to produce electricity. When more thermal energy is needed, the secondary reflector(s) 103 and the light tunnel(s) 106 are moved to an intermediate position along the focal axis perpendicular to the focal point (or the focal line) of the primary reflector(s) 102 toward the opening(s) 107 by an appropriate mechanical component (such as a linear actuator 113, shown in FIG. 3 and one embodiment of a light tunnel retracting mechanism 115 shown in FIG. 5A-C) and a control mechanism (not shown the Figures), thus the proportion of the concentrated sunrays focusing on the heat collecting element(s) 101 (sunrays "a") increases. When the secondary reflector(s) 103 are moved to an intermediate position, the proportion of the reflected sunrays "b" intercepted and redirected to the non-sun facing side of the primary reflector will be between 100% and 0% (for example, 50%), depending upon the precise position. When the secondary reflector(s) 103 are placed at or near the opening(s) 107, 0% or close to 0% of the concentrated sunrays can be intercepted and redirected to the non-sun-collecting side of the primary reflector(s) 102 (sunrays "b") and distributed to the PV cell module(s) 104, therefore 100% or close to 100% of the solar radiation can be contributed to production of thermal energy.

Figure 2:
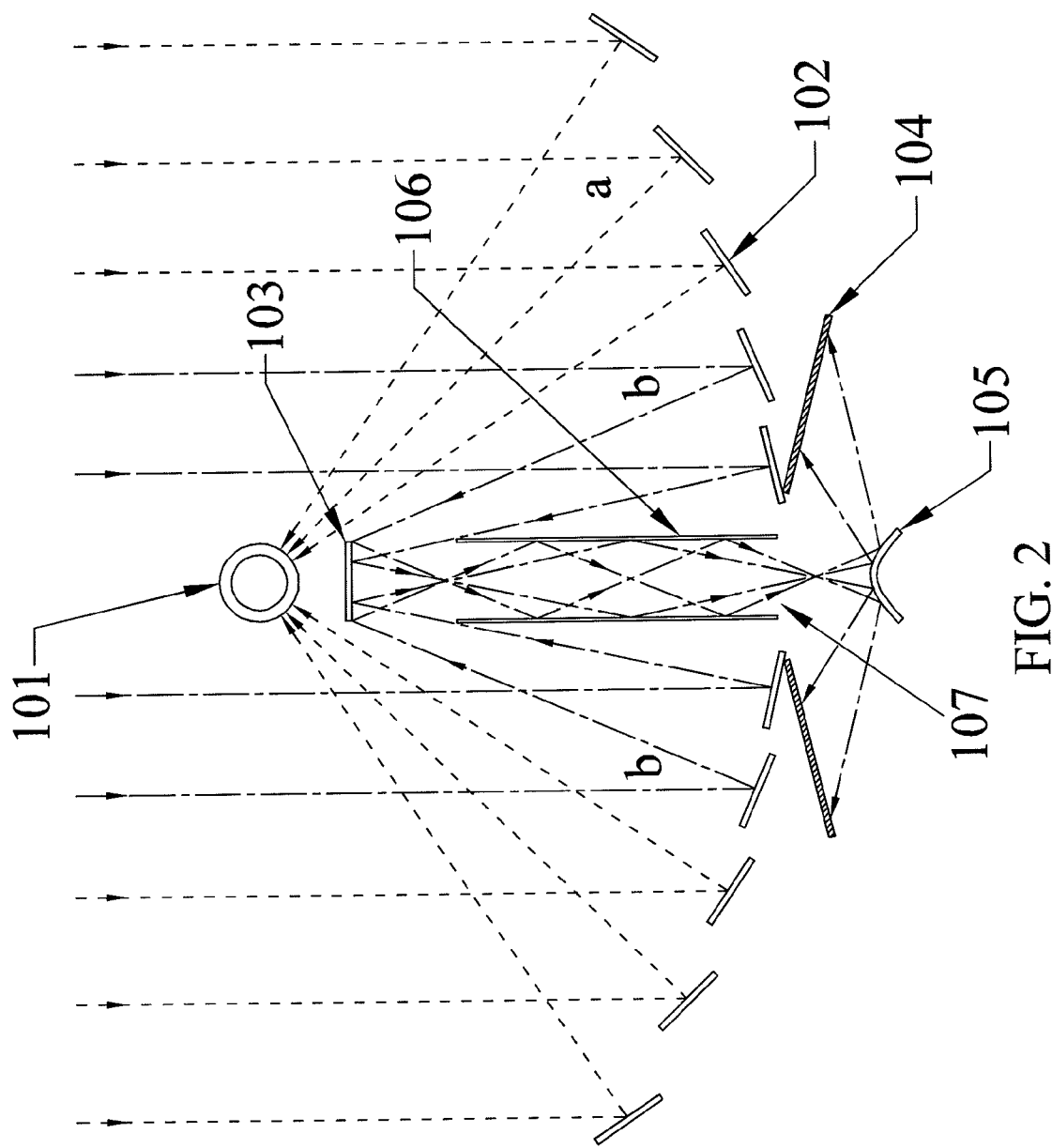
FIG. 2 is a cross sectional view of Fresnel reflector(s) with a sunray directing optical mechanism and a sunray distributing optical mechanism that direct and distribute sunlight to the non-sun-collecting side of the primary reflector set.

Moreover, the cross-sectional view in FIG. 1A applies to both linear focus and point-focus parabolic reflector designs. However, the present embodiment is not limited thereto. For example, referring to FIG. 2, which is a cross sectional view of a Fresnel reflector with sunray directing optical mechanism and a sunray distributing optical mechanism that direct and distribute sunlight to the PV cell modules located on the non-sun-collecting side of the primary reflectors. Generally, in the present invention, the primary reflector(s) 102 may have a flat, Fresnel, curved, parabolic or quasi-parabolic shape or a combination of different reflector geometries. In addition, the present invention may further comprise one or a plurality of heat dissipating mechanisms (not shown) attached to the primary reflector(s) 102.

Figure 3:
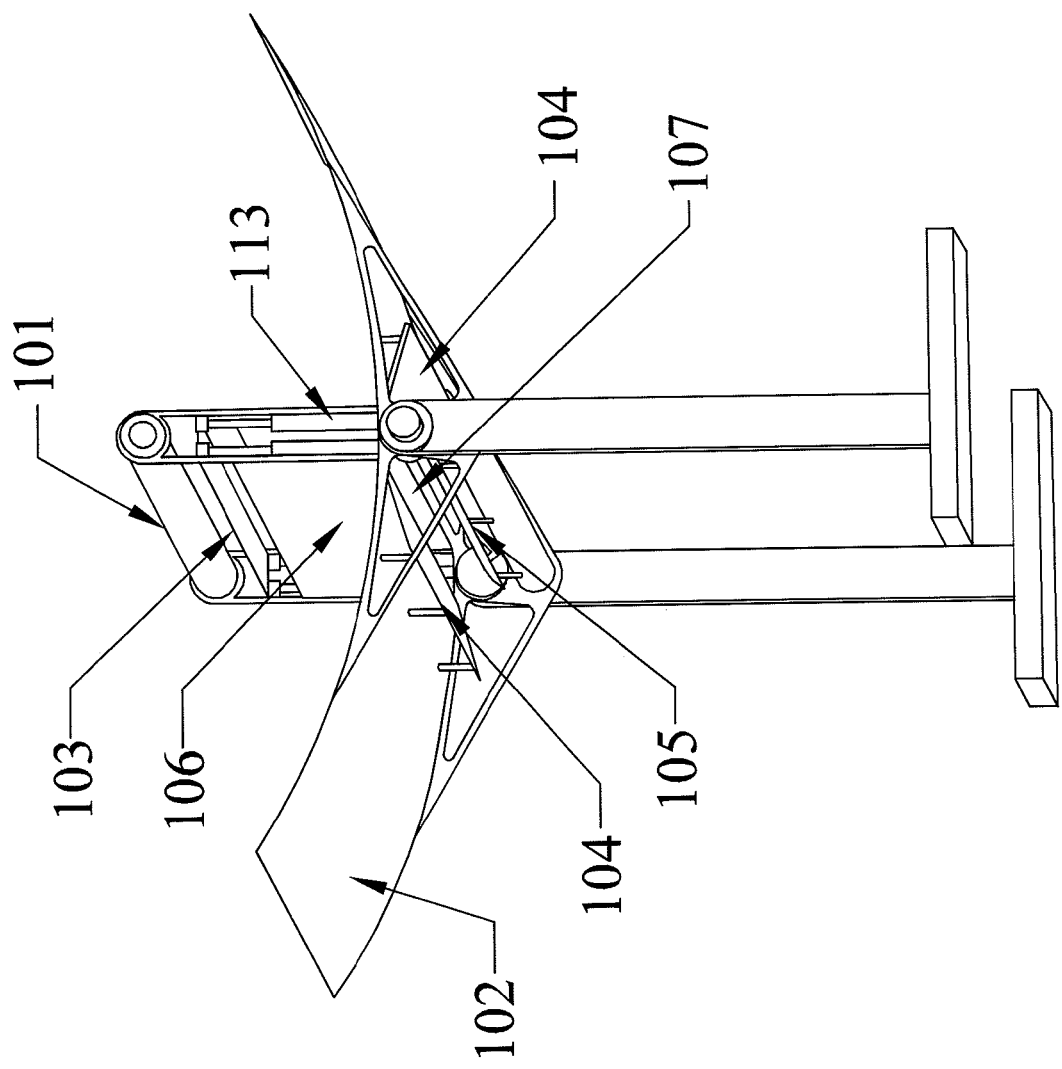
FIG. 3 is a schematic view from the non-sun-collecting side of a typical embodiment of the present invention with a linear focus parabolic primary reflector.
Figure 4:
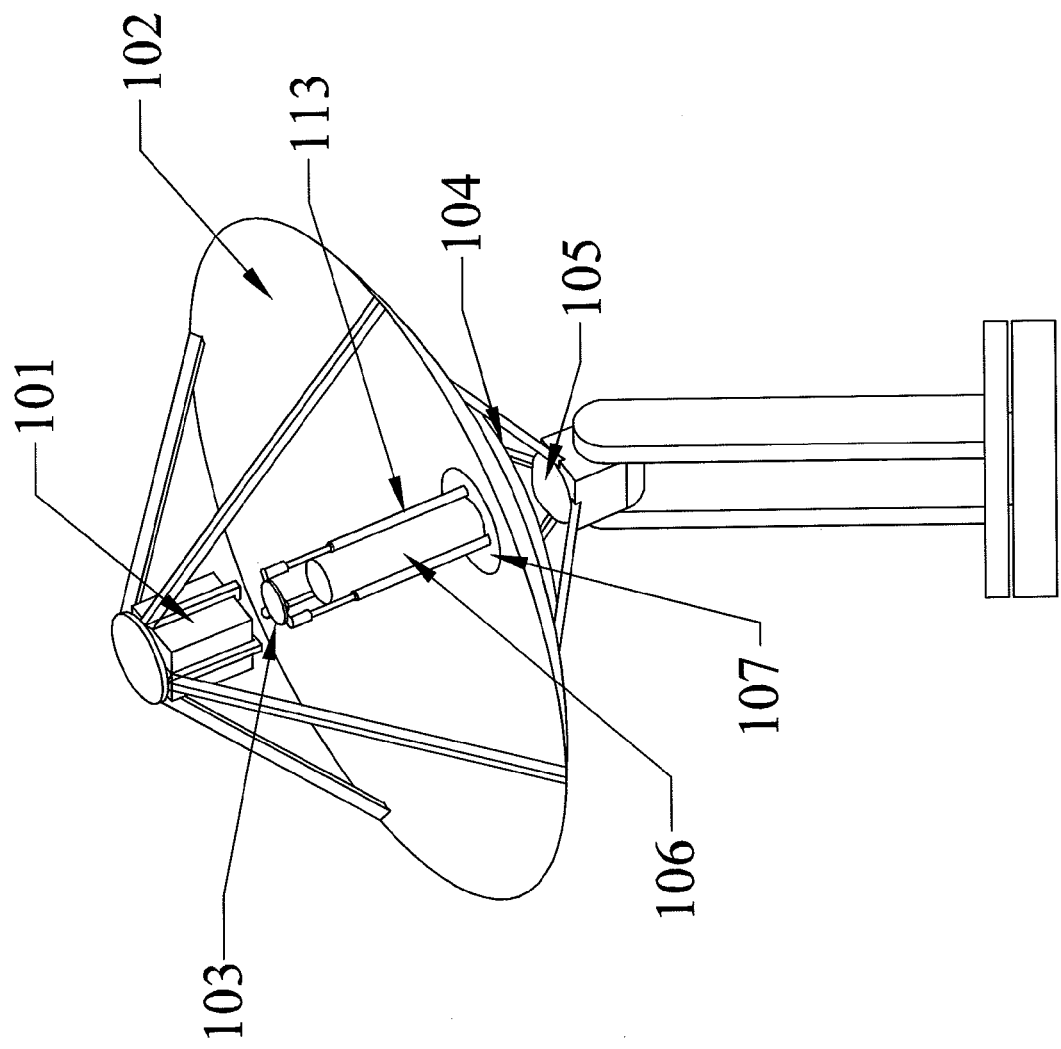
FIG. 4 is a schematic view from the sun-collecting side of another typical embodiment of the present invention with a point-focus parabolic primary reflector.

Referring to FIG. 3, FIG. 3 is a schematic view from the non-sun-collecting side of an exemplary embodiment of the present invention. The heat collecting element(s) 101 may be a receiver tube in this preferred embodiment. The primary reflector(s) 102 that embodies the technology is a linear-focus parabolic or quasi-parabolic trough. The secondary reflector(s) 103 may be a linear reflector running in the axial direction of the primary reflector(s) 102. The light tunnel(s) 106 may be formed by two linear reflectors facing each other and extending parallel to the focal line of the primary reflector(s) 102. The height of the secondary reflector(s) 103 and the light tunnel(s) 106 may be adjustable by proper mechanical devices, such as a linear actuator 113. However, the present embodiment is not limited thereto. For example, FIG. 4 is a schematic view from the sun-collecting side of another exemplary embodiment of the present invention. In particular, referring to FIG. 4, FIG. 4 shows a point-focus (dish) parabolic reflector that embodies the technology of the present invention. For this configuration, the heat collecting element(s) 101 may be a heat engine or a thermal receiver. The secondary reflector(s) 103 may comprise one or more convex or curved reflectors placed on the focal axis of the point-focus primary reflector(s) 102 to redirect sunrays to the PV cell modules 104 placed around the opening(s) 107. The light tunnel(s) 106 being embodied as a light tube with a light-reflecting surface (reflector) on the inner wall.

Figure 5A:
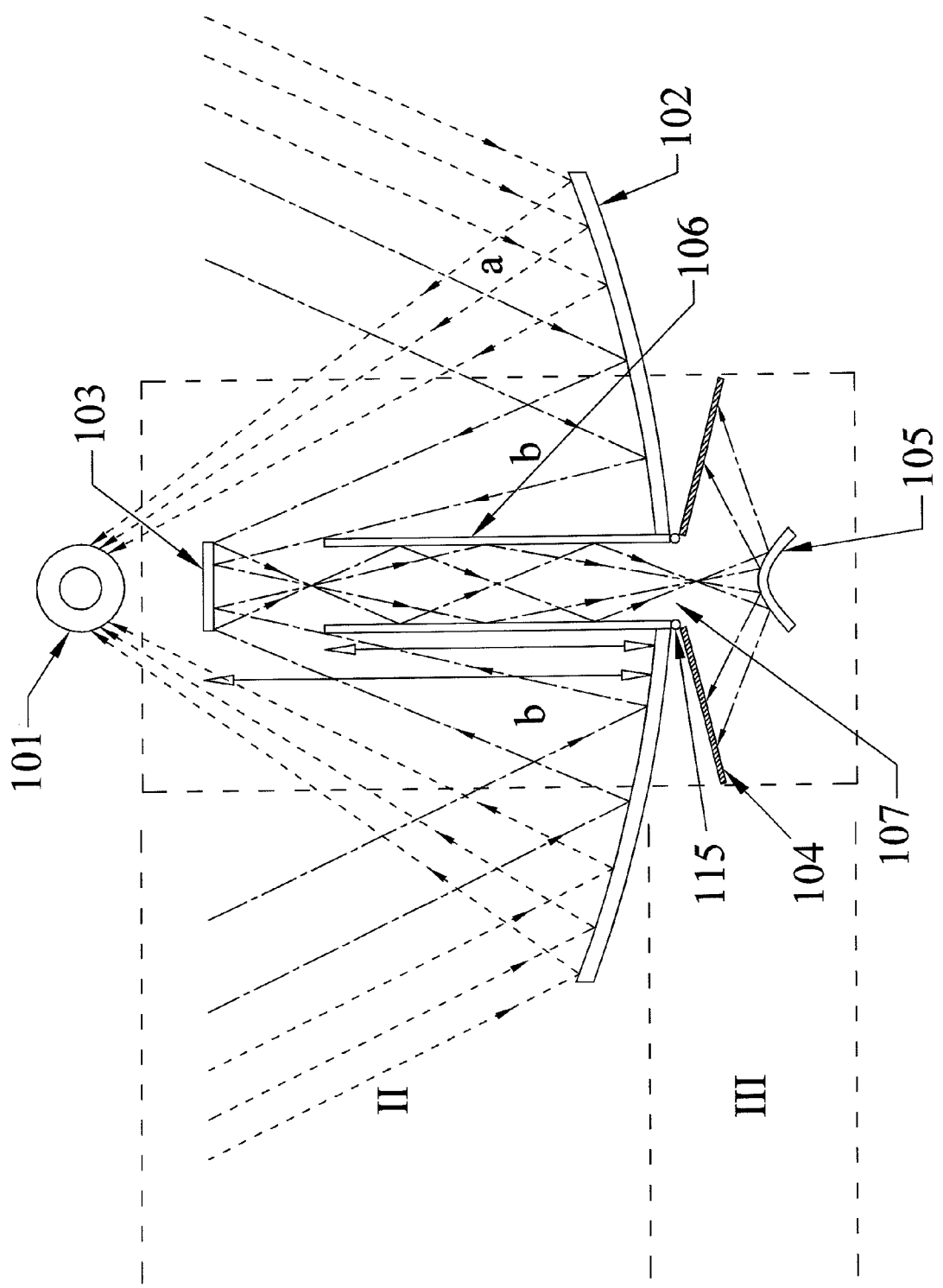
FIGS. 5A-5C are a cross sectional view taken along region I of FIG. 1A, in which a typical embodiment of a sunray directing optical mechanism consisting of a linear secondary reflector and a light tunnel, as well as a typical embodiment of a sunray distributing optical mechanism are shown; by changing the position of the secondary reflector, and the height of the light tunnel using flexible retracting reflectors, the proportion of the intercepted sunrays "b" which is thereafter directed to the non-sun-facing side of the primary reflector is adjusted; three positions of the sunray directing optical mechanism: approximately 100% sunrays "b," intermediate proportion of sunrays "b" and approximately 0% sunrays "b" are shown in FIG. 5A, FIG. 5B, and FIG. 5C respectively. Although the light tunnel is shown with flexible retracting reflectors forming the inner reflecting surface of the light tunnel; this is only one embodiment, segmented linear mirrors or other configurations are possible for adjusting the height of the light tunnels. It is also understood that there may be one or more light tunnels of various lengths, height and cross sections.
Figure 5B:
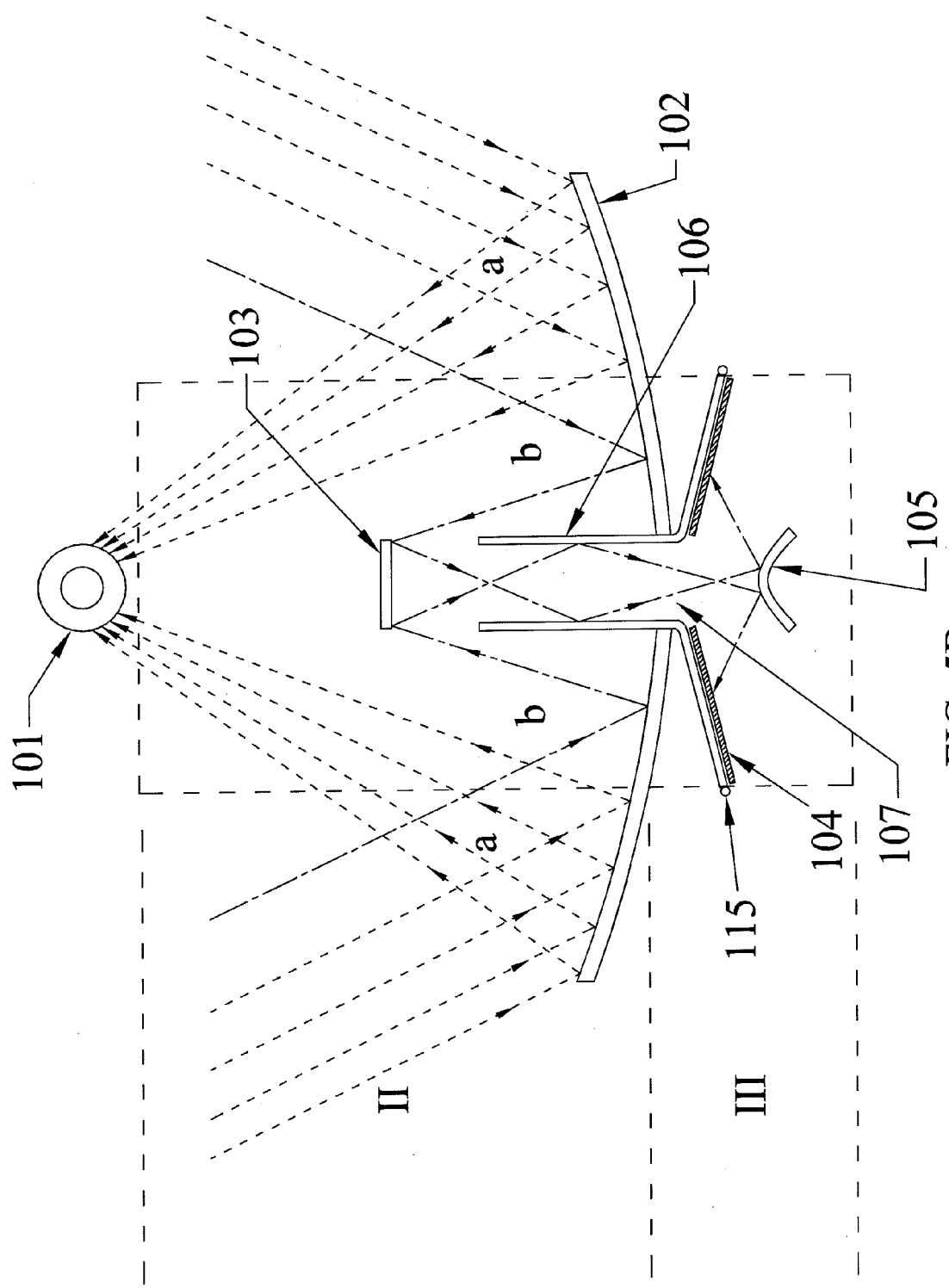
Figure 5C:
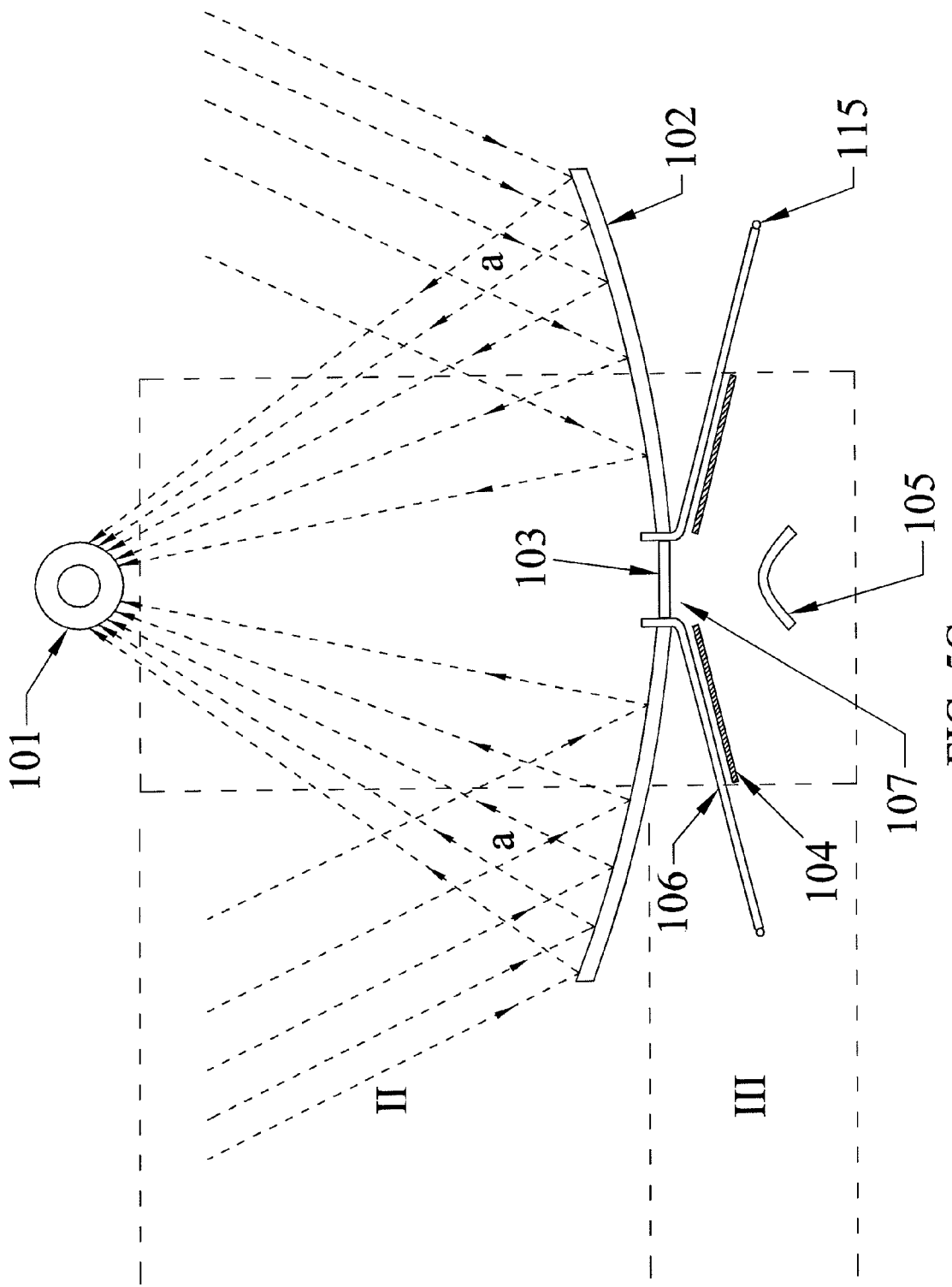

Referring to FIGS. 5A-5C, which are a cross sectional view taken along region I of the FIG. 1A, FIGS. 5A-5C are the first embodiment of an adjustable sunray redistributing optical mechanism (see region I in FIG. 1A) that shows a combination of a sunray directing optical mechanism (see region II in FIGS. 5A-5C) and a sunray distributing optical mechanism located on the non-sun-collecting side of primary reflector(s) 102 (see region III in FIGS. 5A-5C). For the sunray directing optical mechanism, the secondary reflector(s) 103 comprises one or more linear reflectors which reflect the sunrays into the light tunnel(s) 106 formed by two sets of linear reflectors facing each other and extending parallel to the focal line of the primary reflector(s) 102. The sunrays are channeled in-between two sets of linear reflectors and directed down to one or more opening(s) 107 in the primary reflector(s) 102. The position of the secondary reflector(s) 103 is adjustable and controlled by one or more linear actuators 113. The height of the light tunnel(s) 106 are adjusted along with the secondary reflectors 103 and controlled by a retracting mechanism 115 according to the required proportion of sunrays "b." The tertiary reflector(s) 105 being part of the components of the sunray distributing optical mechanism located on the non-sun-collecting side of a primary reflector(s) 102 and which distribute(s) the concentrated sunrays coming out of an opening 107 to one or more PV cell module(s) 104 attached to the non-sun-collecting side of a primary reflector(s) 102. In the present invention, a mechanism designed to distribute concentrated sunrays that exit through opening(s) 107 of the primary reflector(s) 102 to the PV cell module(s) 104 attached to the non-sun-collecting side of the primary reflector(s) 102 is called a sunray distribution optical mechanism. Other exemplary embodiments of the sunray directing optical mechanism and sunray distribution optical mechanism will be described later in this section.

Moreover, the tertiary reflector(s) 105 comprise convex parabolic reflector(s) or bent linear or curved reflector(s) (shown in FIG. 1B) or a plurality of linear or curved reflectors which effectively disperses the sunray exiting from the opening(s) 107 onto the surface of the PV cell module(s) 104 attached to the non-sun-collecting side of the primary reflector(s) 102. The size, shape and curvature of one or more tertiary reflector(s) 105 are chosen according to the different configurations of the sunray directing optical mechanisms to achieve the required sunray coverage the surface of one or more PV cell module(s) 104 and the intended solar intensity (or sun concentration ratio). Using the combination of sunray directing and back-side sunray distributing optical mechanisms, the proportion of solar thermal energy production versus solar PV electricity production can be freely adjusted and optimized.

Figure 6:
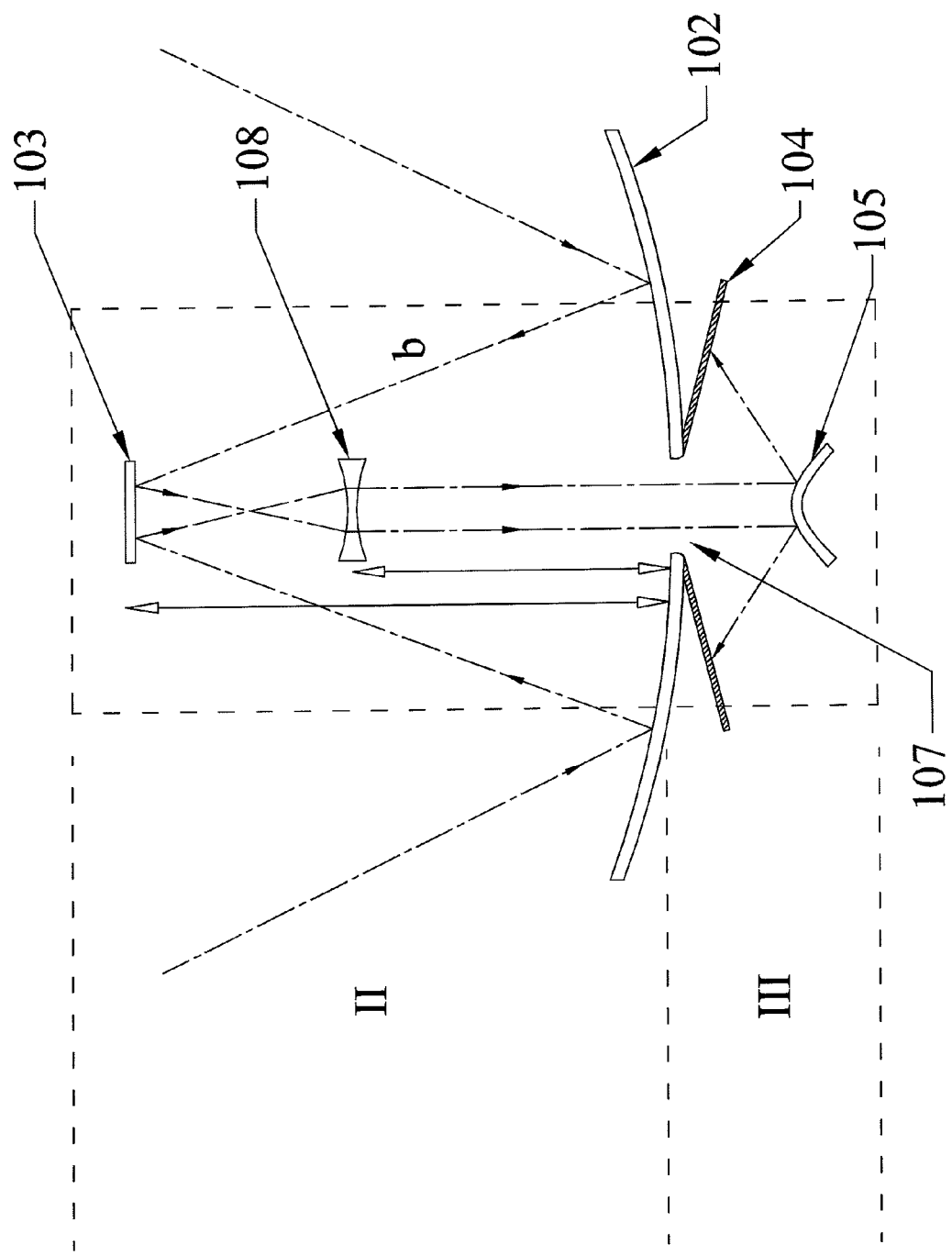
FIG. 6 is a modified embodiment from FIGS. 5A-5C in which a second variation of the sunray directing optical mechanism consisting of a linear secondary reflector and a concave lens, as well as a typical embodiment of a sunray distributing optical mechanism, are shown.

The configuration described in the FIGS. 5A-5C is only for an exemplary embodiment, but is not limited thereto. For example, FIG. 6 is a modified embodiment of an adjustable sunray redistributing optical mechanism. In particular, referring to FIG. 6, FIG. 6 is an adjustable sunray redistributing optical mechanism 2 that shows another version of a combination of a sunray directing optical mechanism (see region II in FIG. 6) and a back-side sunray distributing optical mechanism (see region III in FIG. 6). Referring to FIG. 6, the light tunnel(s) 106 being replaced by one or more concave lenses 108 disposed between the secondary reflector(s) 103 and the primary reflector(s) 102. Therefore, in this embodiment of a sunray directing optical mechanism (see region II in FIG. 6), the secondary reflector(s) 103 reflect the sunrays to the concave lens(es) 108, and the concave lens 108 directs the sunrays down to the opening(s) 107 in the primary reflector(s) 102. Adjustment of the reflected sunray proportion is achieved by adjusting the distance between the secondary reflector(s) 103, as well as the concave lens(es) 108, and the opening(s) 107. In this illustration, the sunray distribution optical mechanism (see region II in FIG. 6) is the same as it is in FIGS. 5A-5C.

Referring to FIG. 7, FIG. 7 is another modified embodiment of an adjustable sunray redistributing optical mechanism. In particular, FIG. 7 is an adjustable sunray redistributing optical mechanism 3 that shows another version of a combination of a sunray directing optical mechanism (see region II in FIG. 7) and a sunray distributing optical mechanism (see region III in FIG. 7). Referring to FIG. 7, in this embodiment of a sunray directing optical mechanism (see region II in FIG. 7), the secondary reflector(s) 103 is a convex reflector set rather than a linear reflector. After the sunrays are reflected from and concentrated by the primary reflector(s) 102, the secondary reflector(s) 103 directs a portion of sunrays down to the opening(s) 107 in the primary reflector(s)

102. The adjustment of reflected sunray proportions is achieved by changing the width (or size) or the reflecting area of the convex reflectors. In this embodiment, an optional light tunnel(s) 106 or concave lens(es) 108 or other suitable optical lenses can also be used to better contain or channel the sunrays "b" as shown in the first and the second embodiment of the sunray directing optical mechanism in FIGS. 5A-5C and 6. Also, the sunray distribution optical mechanism (see region II in FIG. 7) is the same as in FIGS. 5A-5C and 6.

In the preferred embodiment of the present invention, the distance between the secondary reflector(s) 103 and the opening(s) 107, as well as the height of the light tunnel(s) 106 are adjustable, such that the secondary reflector(s) 103 and the reflectors comprising the light tunnel (or light tube) may move along a line perpendicular to the focal point or focal line of the primary reflector(s) 102 to adjust the proportion of the concentrated sunrays directed to the non-sun-collecting side of the primary reflector(s) 102. The secondary reflector(s) 103 may be a linear reflector or a convex reflector, a convex reflector set, or a combination thereof, and the convex reflector may be width adjustable. In another embodiment (see FIG. 6), the distance between the secondary reflector(s) 103 and the opening(s) 107 and the distance between the concave lens(es) 108 and the opening(s) 107 are adjustable to control the proportion of sunrays directed to the non-sun-collecting side of the primary reflector(s) 102. The present invention may incorporate a control system that allows adjustment of the position of the optical components in the sunray directing optical mechanism such that the amount of solar energy directed to the non-sun-collecting side of the primary reflector can be adjusted.

Figure 8A:
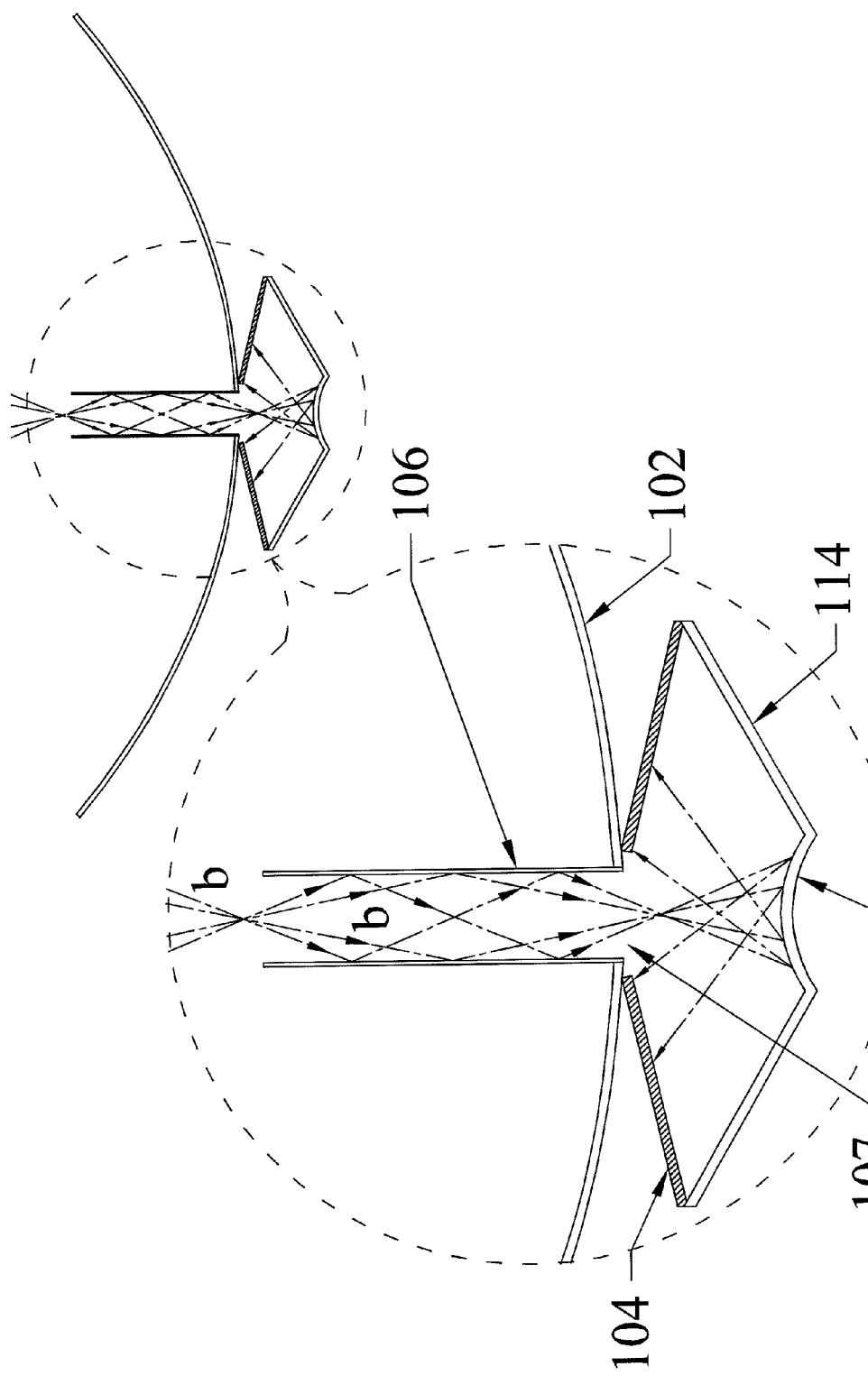
FIGS. 8A-8C are schematic views of the first variation for the design of the back-side sunray distributing optical mechanism positioned at the non-sun-collecting side of the primary reflector(s), in which some embodiments of typical close-structural designs are shown.
Figure 8B:
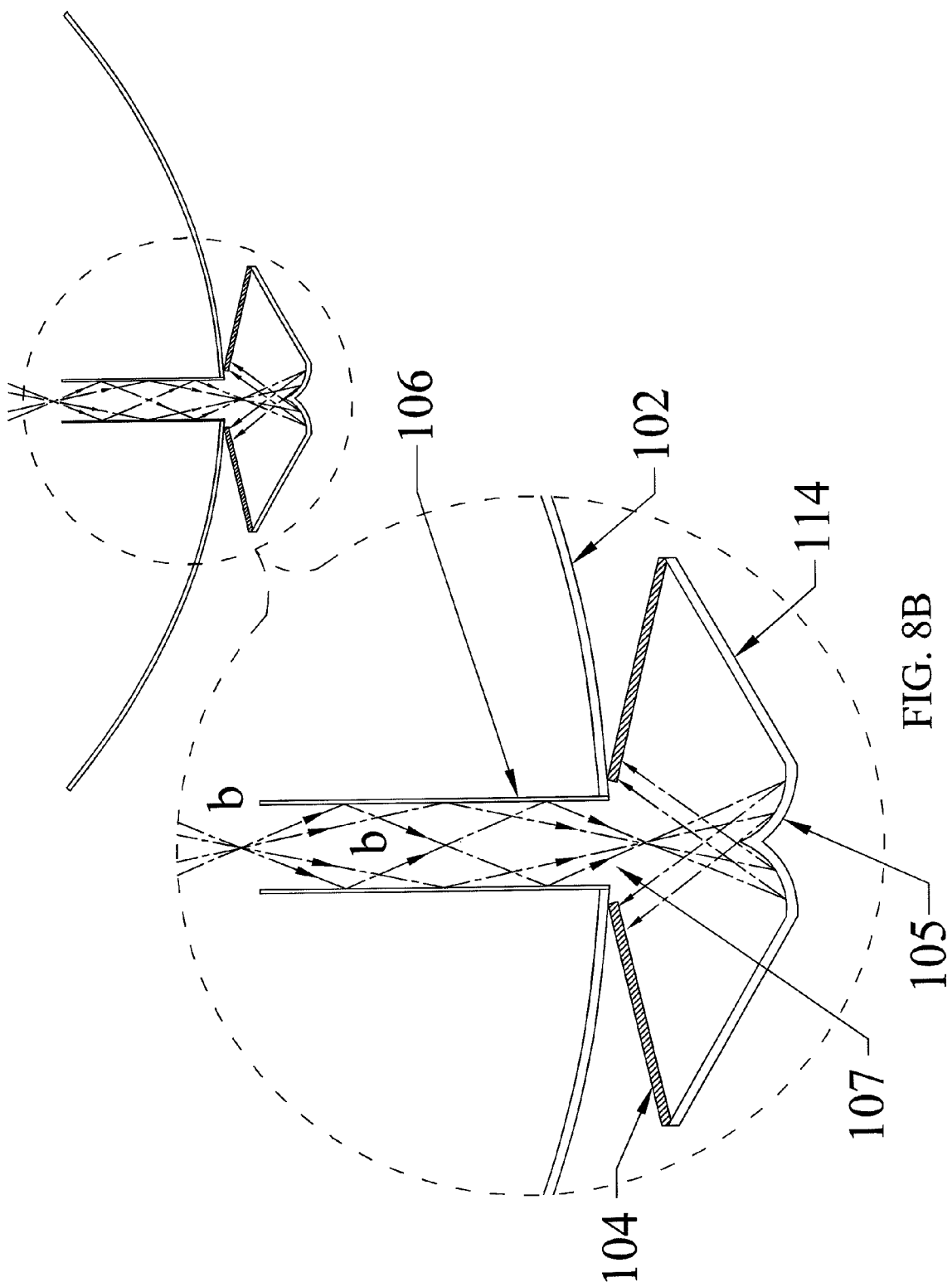
Figure 8C:
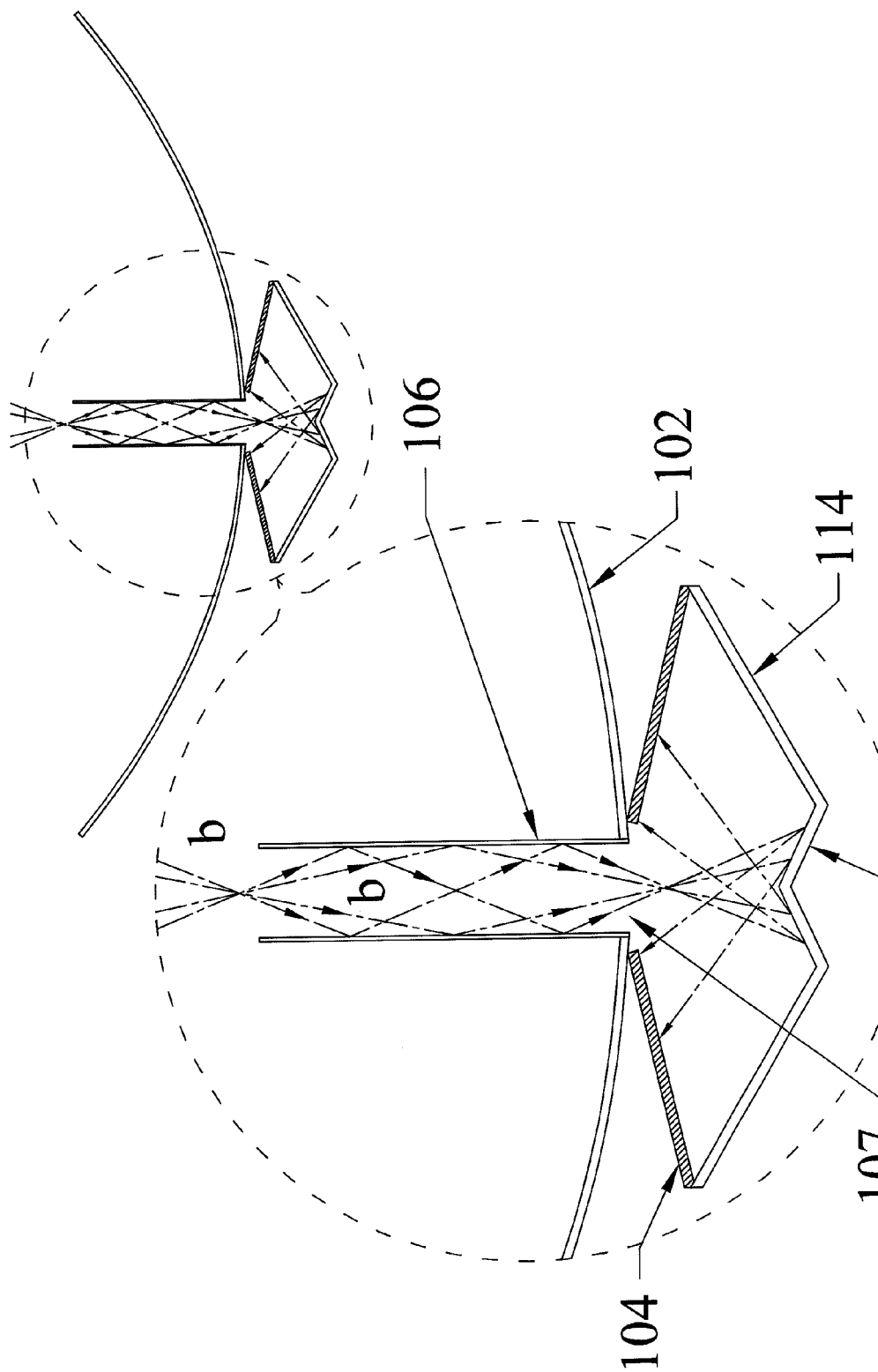

In addition, there are many variations and possibilities for the design of the back-side sunray distributing optical mechanism, as well as the placement location and geometry of PV cell module(s) 104 to achieve a desired solar intensity for the PV cell module(s) 104. Apart from using a parabolic, bent linear, curved reflector or a plurality of linear and curved tertiary reflector(s) 105 and the PV cell attachment as described in FIG. 1, the back-side optical mechanism, the location of PV cell module(s) 104, and the geometry can also be designed to fit the configurations of different sunray directing optical mechanisms to achieve the desired radiation coverage and intensity, and to increase absorption by allowing multiple reflections. For example, referring to FIGS. 8A-8C, FIGS. 8A-8C are schematic views of the first variation for the designs of the back-side sunray distributing optical mechanism. The PV cell module(s) 104, the tertiary reflector(s) 105 and the extension reflectors 114 are formed as a closed structure to minimize the escape of the concentrated sunlight and maximize the radiation exposure of the PV cells by allowing unabsorbed sunrays reflecting multiple times inside the closed chamber before eventually being absorbed by the PV cells. Tertiary reflector(s) 105, formed as curved, bent or other suitable shapes and disposed at a suitable distance from the opening(s) 107, optimize the dispersion of sunrays onto the PV cell module(s) 104. However, the present embodiment is not limited thereto.

Figure 1B:
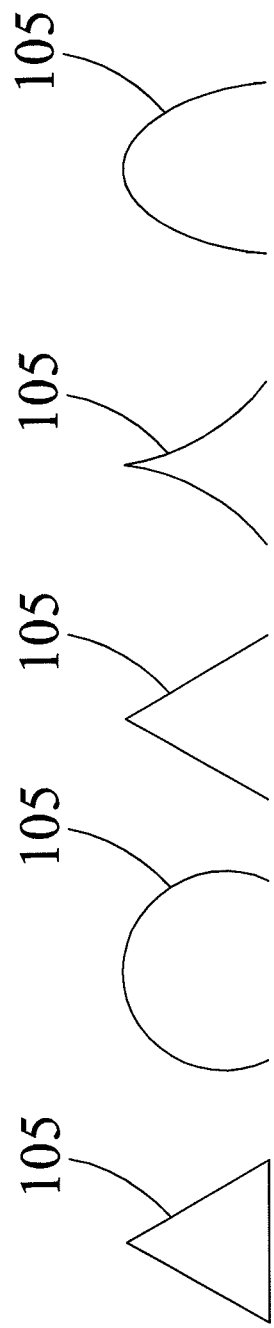
FIG. 1B is a schematic view of various shapes of the tertiary reflector.
Figure 9:
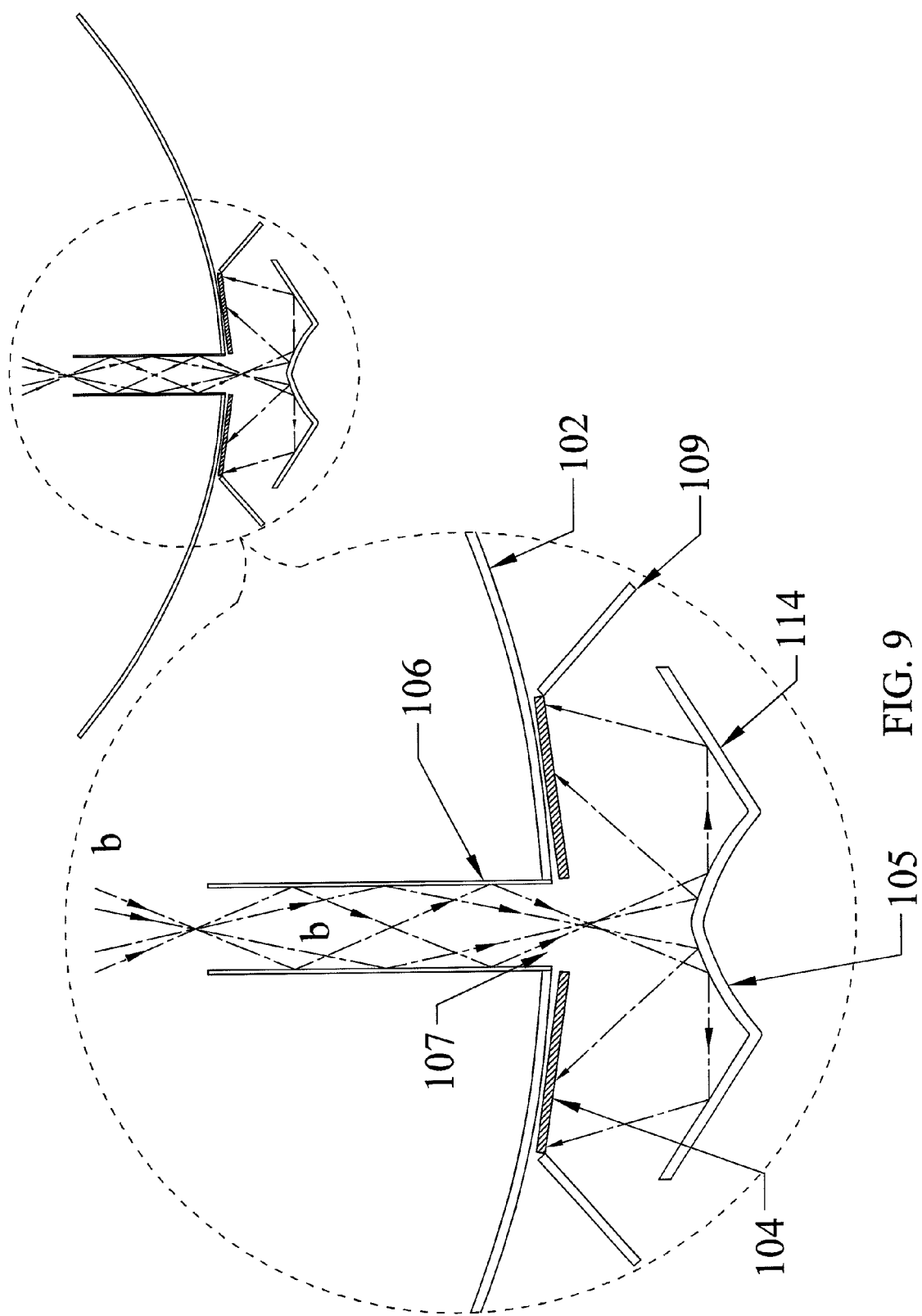
FIG. 9 is a schematic view of the second variation for the design of the back-side sunray distributing optical mechanism positioned at the non-sun-collecting side of the primary reflector(s), in which one exemplary embodiment of a typical open-structural design is shown.

For example, referring to FIG. 9, FIG. 9 is a schematic view of the second variation for the design of the back-side sunray distributing optical mechanism. The present invention further comprises extension reflector(s) 109 formed in the vicinity of the periphery of PV cell module(s) 104 and between the PV cell module(s) 104 and the tertiary reflector(s) 105. The extension reflector(s) 109 redirect(s) sunrays reflected off the PV cell module(s) 104 and the tertiary reflector(s) 105. The PV cell module(s) 104, the extension reflector(s) 109, and the tertiary reflector(s) 105 are formed as an open structure. The tertiary reflector(s) 105 in a curved shape configuration with linear extension reflectors 114 is one of the suitable reflector geometries for optimizing reflection of the sunrays onto PV cell module(s) 104. The tertiary reflector(s) 105 can also be triangular, curved, bent or other suitable shapes such as shown in FIG. 1B, with extensions of suitable geometries (not shown in the figures).

Figure 10A:
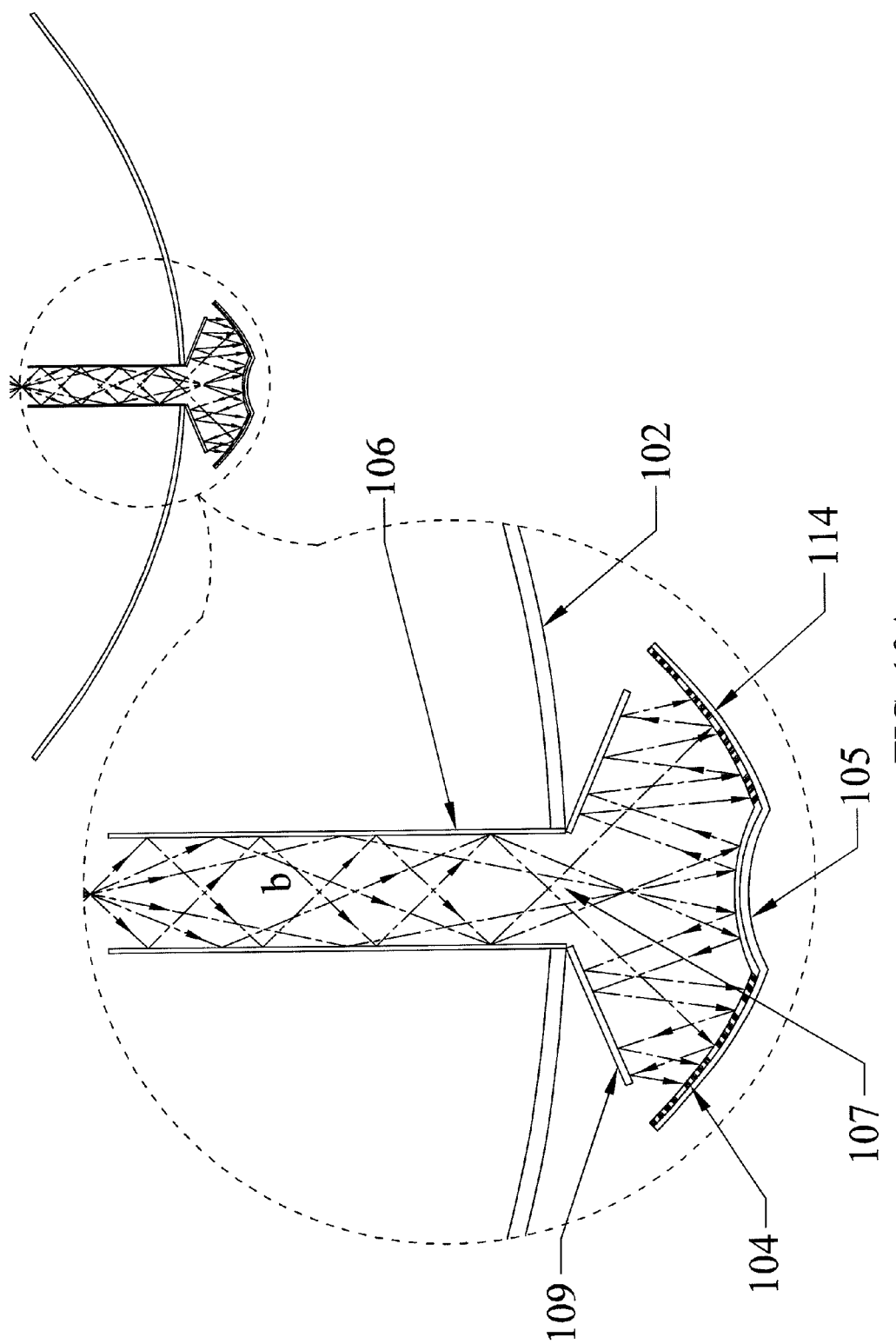
Figure 10B:
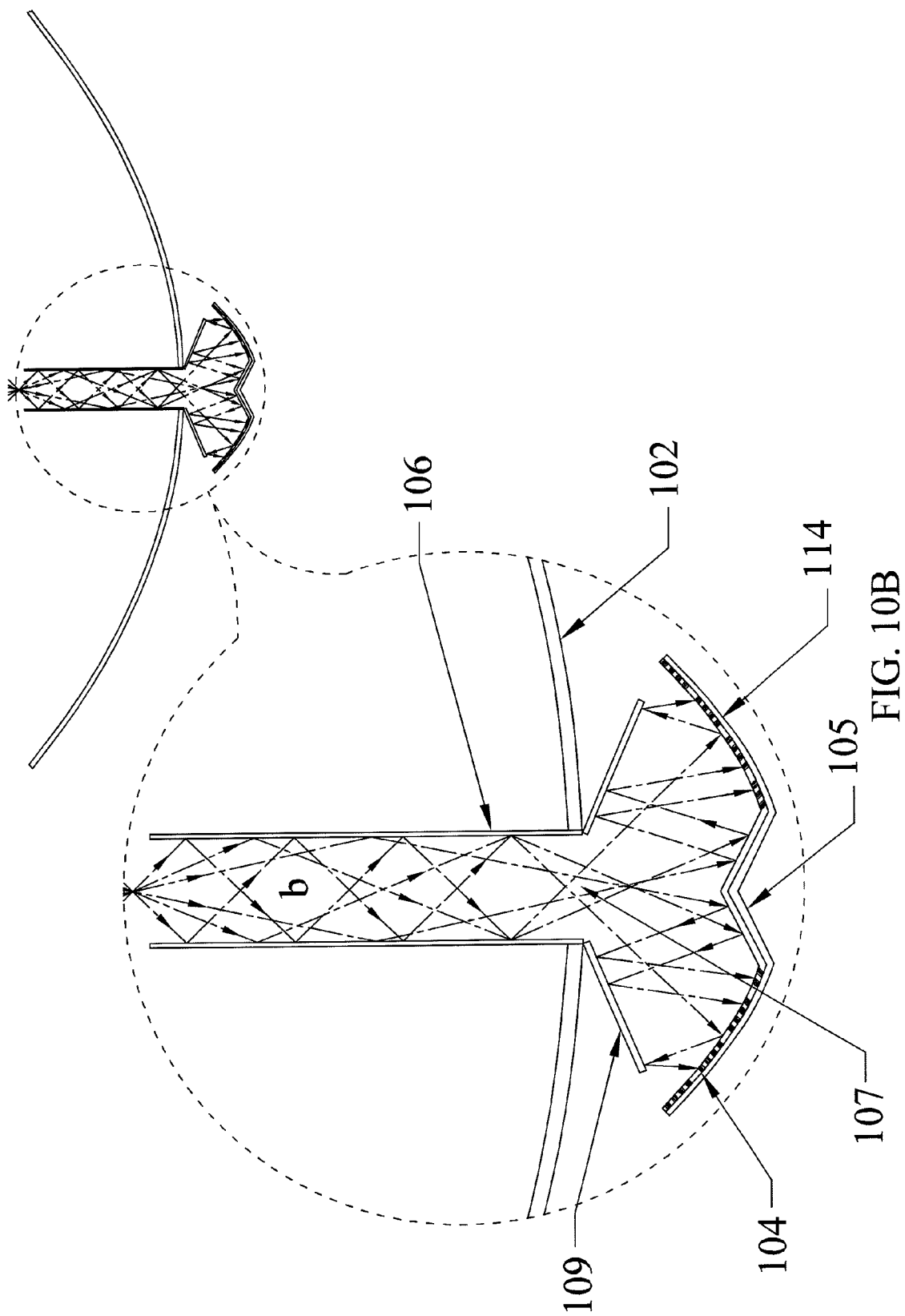

On the other hand, referring to FIGS. 10A-10C, which are schematic views of the third variation for the design of the back-side sunray distributing optical mechanism. The tertiary reflector(s) 105 being located below the primary reflector(s) 102 and close to the opening(s) 107. The tertiary reflector(s) 105 may be curved, triangle, bent, arc or other suitable geometries and may have tertiary extension reflectors 114 in linear shape or other suitable shapes and the PV cell module(s) 104 fully or partially covering these. The extension reflector(s) 109 allow redirecting light bounced off the PV cell module(s) 104 and the tertiary reflector(s) 105 and the extension reflectors 114 disposed underneath. Also, the PV cell module(s) 104, the extension reflector(s) 109, and the tertiary reflector(s) 105 and their tertiary extension extensions 114 are formed as an open structure or a closed structure. Other optical mechanism such as convex or concave lenses (not shown in the figures) can be placed at or near the opening(s) 107 to better disperse and distribute the sunrays. The geometry of the tertiary reflector(s) 105, their extensions 114 and other extension reflector(s) 109, and the placement of PV cell module(s) 104 being designed to optimize light distribution and radiation absorption by the PV cell module(s) 104.

Figure 11:
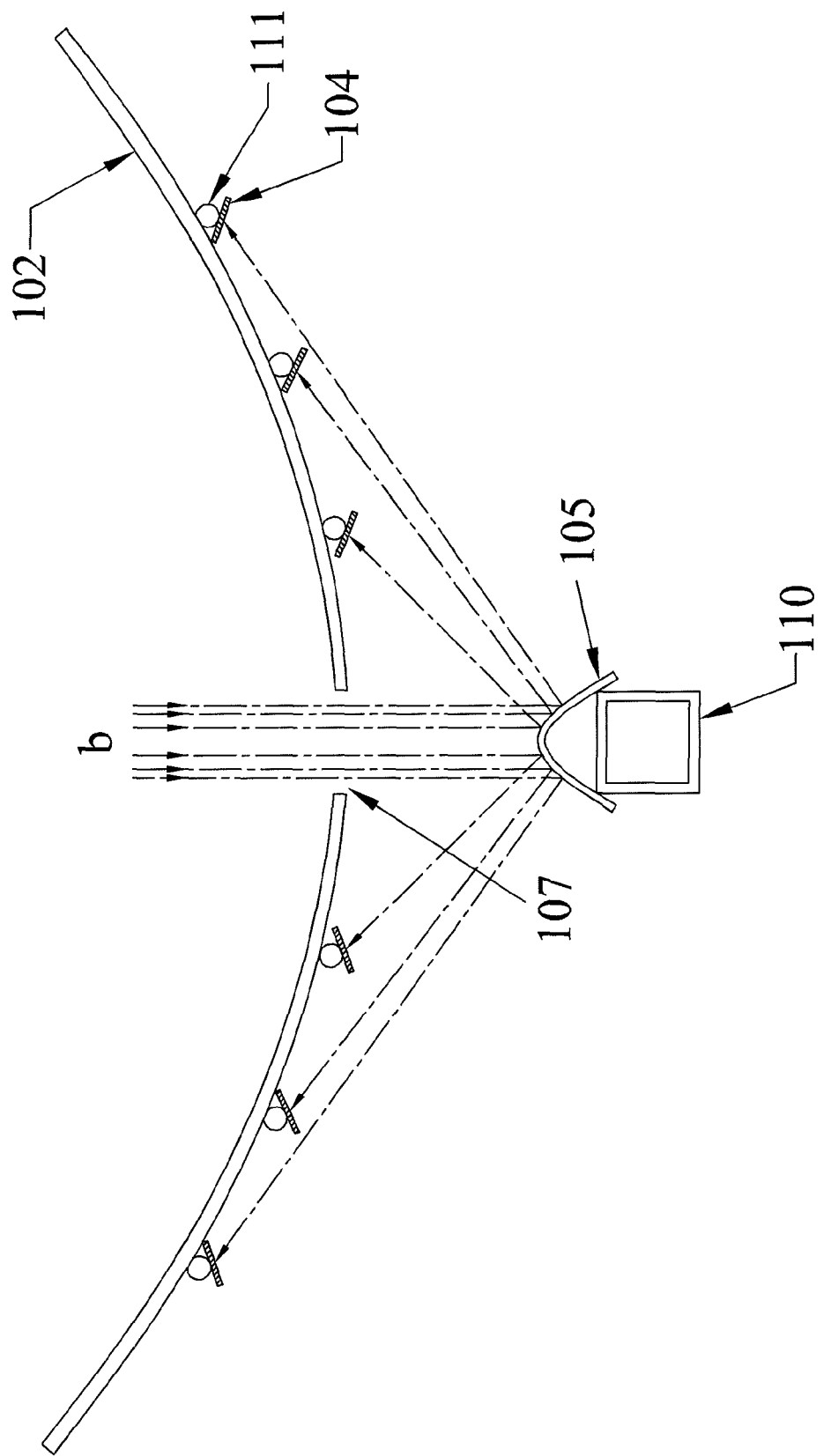
FIG. 11 is a schematic view of the fourth variation for the design of the sunray distributing optical mechanism positioned at the non-sun-collecting side of the primary reflector(s), in which one exemplary embodiment using structural components of the primary reflector and their extensions to attach reflectors and/or PV cell modules is shown.
Figure 12:
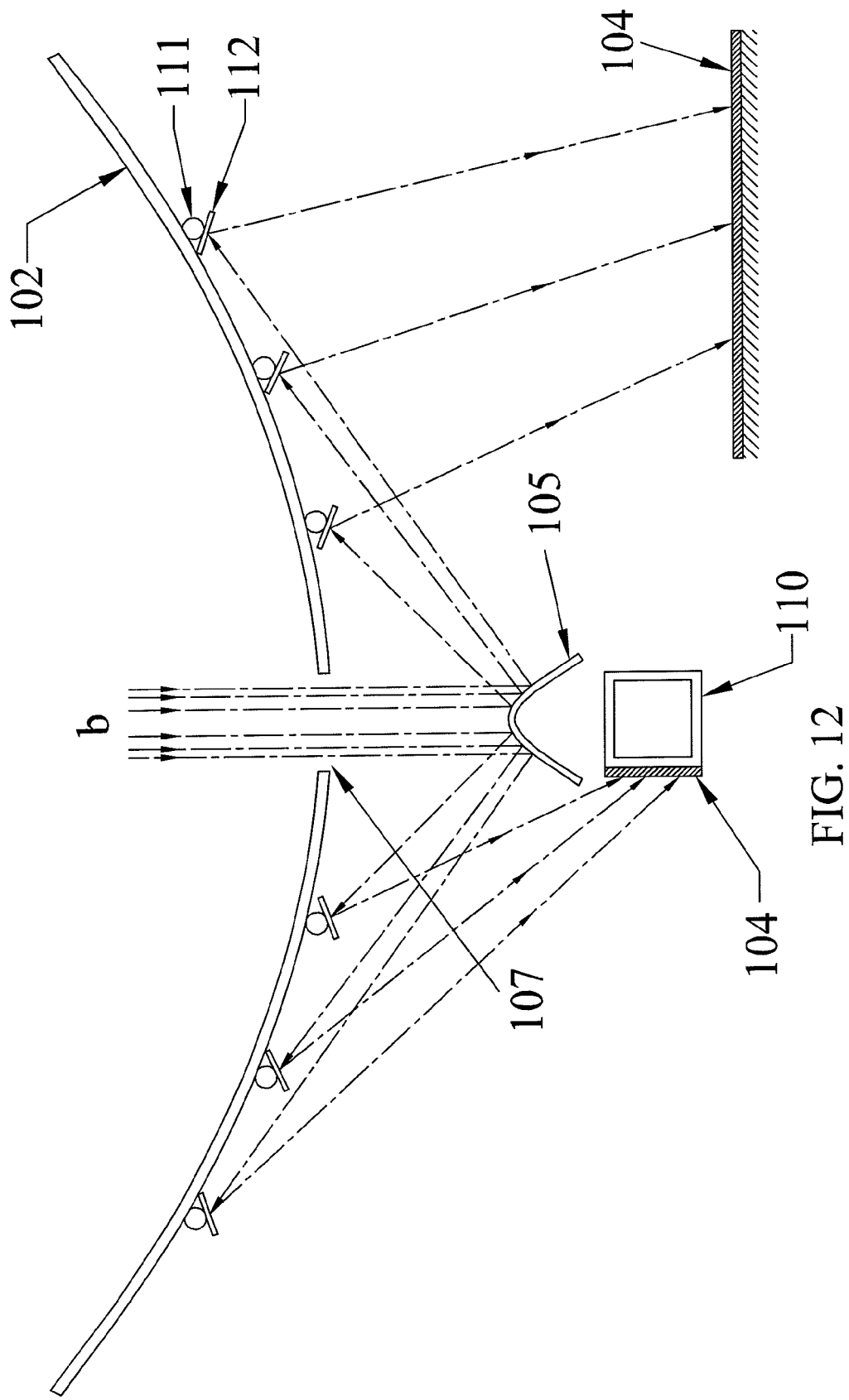
FIG. 12 is a schematic view of the fifth variation for the design of the sunray distributing optical mechanism positioned at the non-sun-collecting side of the primary reflector(s), in which one embodiment using structural components and structural extensions and additional ground structures to attach reflectors and/or PV cell modules is shown.

Referring to FIG. 11, which is a schematic view of the fourth variation for the design of the back-side sunray distributing optical mechanism. The present invention may comprise: a central structural component 110 disposed below the tertiary reflector(s) 105, a plurality of supporting structural components 111 attached to the non-sun-collecting side of the primary reflector(s) 102. One or more PV cell module(s) 104 may be attached to the plurality of the supporting structural components 111 respectively on the non-sun-collecting side of the primary reflector(s) 102. The PV cell module(s) 104 may be moved or rotated manually or automatically to allow changing the sunray's cover range or to change the intensity of solar energy on the PV cell module(s) 104. Also, the present embodiment is not limited thereto. For example, referring to FIG. 12, FIG. 12 is a schematic view of the fifth variation for the design of the back-side sunray distributing optical mechanism. The present invention may further comprise a plurality of reflectors 112 attached to the plurality of supporting structural components 111 of the primary reflector(s) 102 respectively. In addition, the PV cell module(s) 104 are disposed at one or more sides of the central structural component 110 of the primary reflector(s) 102 and/or on the ground or to other structures attached to the ground (ground in this context includes any surface beneath the solar energy structure including ship decks, piers, offshore structures or other surfaces). Therefore, the placement area, location and geometry of PV cell module(s) 104 are designed to receive sunrays distributed by the sunray distributing optical mechanism to achieve desired solar intensity for the PV cell module(s) 104 and to fit the geometry of the structural components of the present invention.

Figure 13:
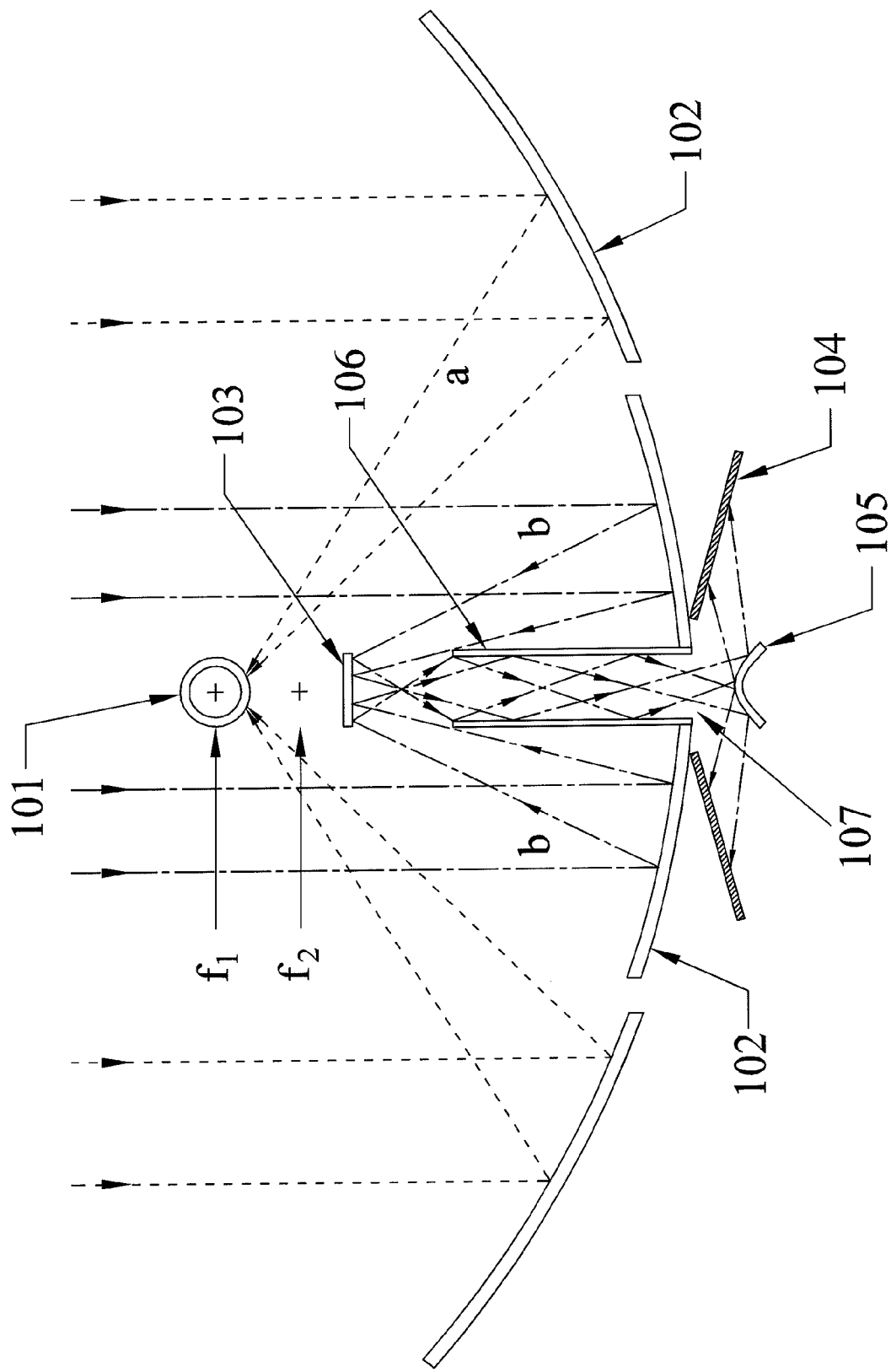
FIGS. 13 and 14 are examples of a dual-focus parabolic concentrator and a dual-focus Fresnel concentrator respectively for a combined thermal-PV concentrator system.
Figure 14:
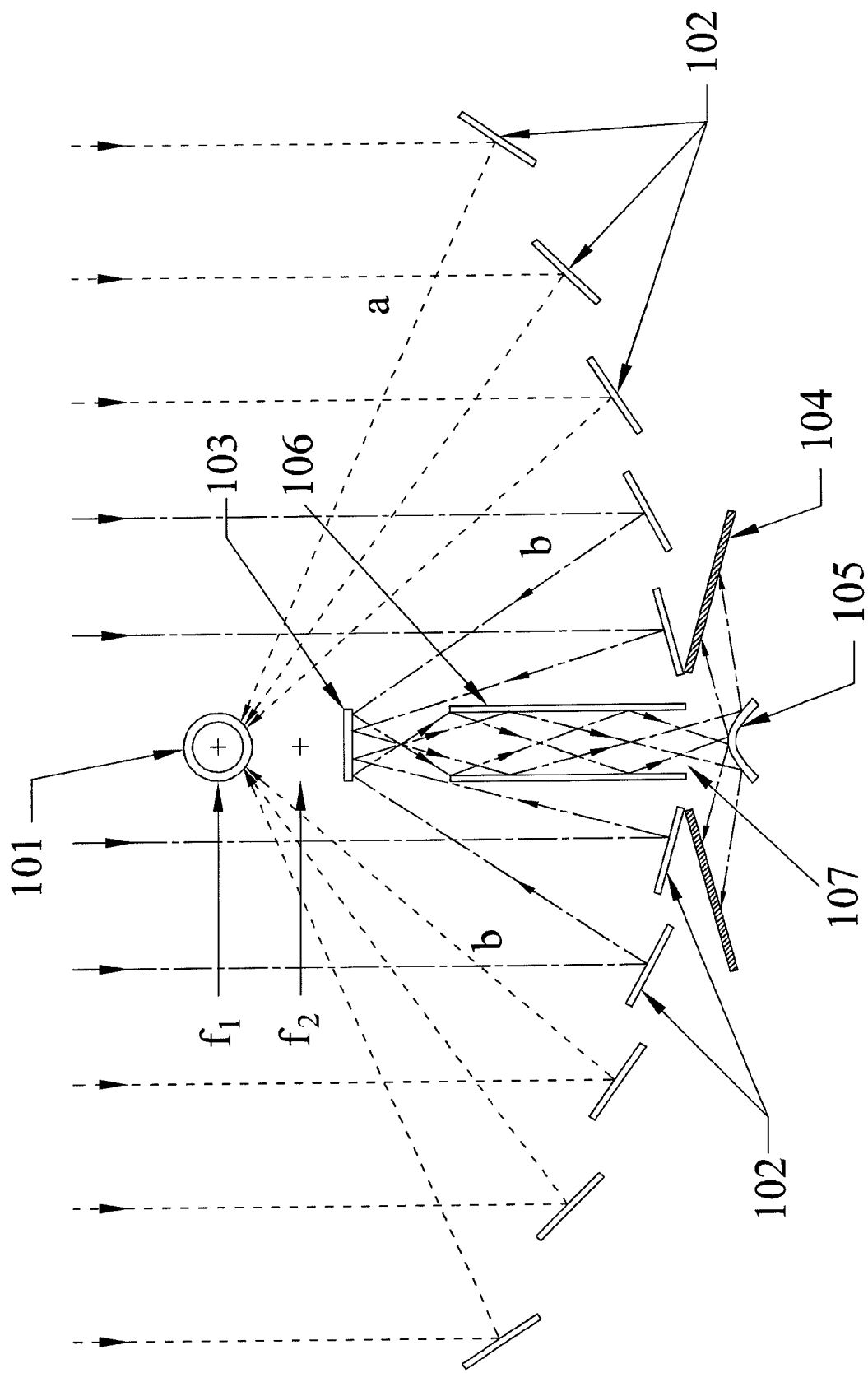

Other geometries of the primary reflector system can also take advantage of the sunray directing and distributing optical mechanism and make use of the back-side of the primary reflector. For example, FIGS. 13 and 14 are examples of a dual-focus parabolic concentrator and a dual-focus Fresnel concentrator respectively for a combined thermal-PV concentrator system. In addition, the cross sections in FIGS. 13 and 14 could represent either linear focus concentrator systems or point-focus concentrator systems. In particular, referring to FIG. 13, the primary reflector(s) 102 being discontinuous and adjustable such that the primary reflector(s) 102 can provide both a first focal line f1 and a second focal line f2 for a linear reflector system or both a first focal point f1 and a second focal point f2 for a dish type reflector. The sunrays irradiated to the first portion of primary reflector(s) 102 having first focal line f1 (or focal point f1) are reflected (see lines "a" in FIG. 13) to the heat collecting element(s) 101 positioned at the first focal line f1 (or focal point f1). The sunrays irradiated to the second portion of the primary reflector(s) 102 having a second focal line f2 (or focal point f2), a portion of the sunrays (from 0% to 100%) are directed to the PV cell module(s) 104 through the secondary reflector(s) 103, the light tunnel(s) 106, and the tertiary reflector(s) 105 (see lines "b" in FIG. 13). The various sunray directing mechanisms and their adjustments for the proportions directed to the PV cell module(s) 104, as well as the configurations of various sunray distributing mechanisms that can be used with the dual-focus embodiment are the same as what are described in FIG. 1 through FIG. 12. Although two primary focal lines or focal points are illustrated, the present invention is not limited to two focal lines or focal points, if desired additional focal lines or focal points can be obtained by suitable positioning of the primary reflector(s) 102. The position of secondary reflector(s) 103 or heat collecting element(s) 101 are also adjustable and may be located at any distance with respect to the focal lines or focal points. Also, referring to FIG. 14, the primary reflector(s) 102 with first focal line f1 (or focal point f1) and second focal line f2 or (focal point f2) concentrate the sunrays using a dual-focus Fresnel concentrator and directs all or a portion of the solar energy to PV cells attached to the non-sun-collecting side of the primary reflector(s) 102. Although two primary focal lines or focal points are illustrated in FIG. 13 and FIG. 14, the present invention is not limited to two focal points, if desired additional focal lines or focal points can be obtained by suitable positioning of the primary reflector(s) 102. The position of secondary reflector(s) 103 or heat collecting element(s) 101 are also adjustable and may be located at any distance with respect to the focal distance.

While the means of specific embodiments in present invention has been described by reference drawings, numerous modifications and variations could be made thereto by those skilled in the art without departing from the scope and spirit of the invention set forth in the claims. These modifications and variations would be in a range outlined by the specification of the present invention.

What is claimed is:

1. An interchangeable and fully adjustable solar thermal-photovoltaic concentrator system, comprising:
   one or more heat collecting elements;
   one or more primary reflector that focuses sunrays and has a reflective side facing the incoming sunlight from the sun and facing the heat collecting element and wherein when there is one primary reflector, there is an opening therethrough to allow light to pass and when there are a plurality of primary reflectors there is at least one opening therebetween,
   wherein the one or more primary reflectors has an optical focus located on the reflective side of the one or more primary reflectors such that the incoming sunlight is reflected to and concentrated on the optical focus, wherein the heat collecting element(s) is placed at or adjacent to the focus of the one or more primary reflectors;
   a sunray directing optical mechanism that intercepts a proportion of the sunlight reflected toward the optical focus of the one or more primary reflectors and redirects the intercepted sunrays from a sun-collecting side of the one or more primary reflectors to a non-sun-collecting side of the one or more primary reflectors, wherein the sunray directing optical mechanism is disposed at the sun-collecting side of the one or more primary reflectors and between the heat collecting element and the openings;
   one or more PV cell modules positioned between the primary reflectors and a sunray distributing mechanism, disposed at the non-sun-collecting side of the primary reflectors and wherein the one or more PV cell modules are positioned to accept light that is distributed from the sunray distributing optical mechanism to generate electricity;
   wherein the sunray distributing optical mechanism distributes sunrays redirected to the non-sun-collecting side of the primary reflectors to the PV cell modules, said sunray distributing optical mechanism and said PV cell modules are disposed at the non-sun-collecting side of the primary reflectors;
   wherein after sunrays irradiate on the one or more primary reflectors and are reflected toward the optical focus of the one or more primary reflectors, a portion of sunrays is intercepted and redirected by the sunray directing optical mechanism, through the opening or openings in the one or more primary reflector or reflectors, and distributed to the PV cell modules by the sunray distributing optical mechanism, whereas the remaining portion of sunrays continues to travel toward the optical focus of the one or more primary reflectors and is concentrated on the heat collective element.

2. The concentrator system of claim 1, wherein the primary reflectors are linear-focus or point-focus concentrating reflectors.

3. The concentrator system of claim 1, wherein the primary reflectors have a flat, Fresnel, curved, parabolic, quasi-parabolic shape or a combination thereof.

4. The concentrator system of claim 1, wherein the sunray directing optical mechanism comprises one or more secondary reflectors that reflect and redirect the concentrated sunrays toward the openings in the primary reflectors.

5. The concentrator system of claim 4 wherein the secondary reflector is a linear reflector, a linear reflector set, a convex reflector, a convex reflector set, a curved reflector, a curved reflector set, or a combination thereof.

6. The concentrator system of claim 4 wherein the distance between the secondary reflectors and the openings is fixed or adjustable and is supported by structural components and controlled by a height adjusting mechanical apparatus.

7. The concentrator system of claim 6, wherein the secondary reflector is fixed in width or size or is width or size adjustable and is supported by structural components and controlled by a width adjusting mechanical apparatus.

8. The concentrator system of claim 1, wherein the sunray directing optical mechanism in a concentrator system with linear-focus primary reflectors, further comprises one or more light tunnels of fixed height or adjustable height disposed between the secondary reflectors and the one or more openings in the primary reflectors and also extending in a direction of a focal line of the primary reflectors and formed by a plurality of linear or curved reflectors facing each other.

9. The concentrator system of claim 8, wherein the height, length or opening of the one or more light tunnels is adjustable and supported by structural components and controlled by an adjusting mechanical apparatus or by use of moveable flexible or segmented reflectors that form the light tunnel.

10. The concentrator system of claim 1, wherein the sunray directing optical mechanism, in the concentrator system with the one or more point-focus primary reflectors, further comprises one or more light tubes of fixed or adjustable height with a reflecting surface along an inner wall and extending along the focal axis direction of the primary reflectors and disposed between the secondary reflectors and the openings.

11. The concentrator system of claim 10, wherein the height, length or opening of the one or more light tubes is adjustable and supported by structural components and controlled by an adjusting mechanical apparatus or by use of moveable flexible or segmented reflectors that form the light tubes.

12. The concentrator system of claim 1, wherein the sunray directing optical mechanism further comprises a lens with concave shape or one more lenses with suitable shapes disposed at the sun-collecting side of the primary reflectors and between the secondary reflectors and the openings.

13. The concentrator system of claim 12, wherein the distance between the openings and the lens with concave shape or one or more lenses with suitable shapes is adjustable and is supported by additional structural components and controlled by a height adjusting mechanical apparatus.

14. The concentrator system of claim 1, wherein the heat collecting element comprises one or more heat receiver tubes, one or more heat absorption devices or one or more heat engines or a combination thereof.

15. The concentrator system of claim 1, wherein the sunray distributing optical mechanism comprises one or more tertiary reflectors disposed at a predetermined distance from the openings of the primary reflectors on the non-sun-collecting side, with a reflective surface facing the concentrated sunrays directed through the openings.

16. The concentrator system of claim 15, wherein the tertiary reflectors are a linear reflector set, a convex reflector, a convex reflector set, a concave reflector, a concave reflector set, a curved reflector, a curved reflector set, or a combination thereof.

17. The concentrator system of claim 15, further comprising one or more extension reflectors, wherein the extension reflectors are disposed below the primary reflectors near the opening, attached to parts of the primary reflectors, connected to the tertiary reflectors or the PV cell modules, or used for placement of the PV cell modules.

18. The concentrator system of claim 15, further comprising one or more extension reflectors disposed below the primary reflectors near the openings and extended from the tertiary reflectors, wherein the tertiary reflectors, the extension reflectors and the PV cell modules are formed as part of a closed structure or an open structure to allow multiple reflections, improve distribution of and increase the absorption of the sunrays redirected to the non-sun-collecting side of the primary reflectors.

19. The concentrator system of claim 15, further making use of one or more structural components of the primary reflectors disposed below the tertiary reflectors or a plurality of supporting structural components attached to or supporting the primary reflectors on the non-sun-collecting side or the sun collecting side of the primary reflectors to attach or support the components of the sunray distributing optical mechanism or the PV cell modules.

20. The concentrator system of claim 19, wherein the PV cell modules are attached to the structural components, including central and supporting structural components, of the primary reflectors.

21. The concentrator system of claim 19, further comprising a plurality of reflectors attached to the supporting structural components of the primary reflectors.

22. The concentrator system of claim 21, wherein the PV cell modules are disposed at one or more sides of a central structural component or on ground, a ground structure or a surface located beneath or adjacent to the solar concentrator structure.

23. The concentrator system of claim 1, wherein the primary reflectors are adjustable and have a first focal line and a second focal line, or have a plurality of focal lines in a concentrator system with linear-focus primary reflectors.

24. The concentrator system of claim 23, wherein the heat collecting element is disposed at or near one or more focal lines.

25. The concentrator system of claim 1, wherein the primary reflectors are adjustable and have a first focal point and a second focal point, or have a plurality of focal points in a concentrator system with point-focus primary reflectors.

26. The concentrator system of claim 25, wherein the heat collecting element is disposed at or near one or more focal points.

27. The concentrator system of claim 1, further comprising one or a plurality of heat dissipating mechanisms attached to the primary reflectors or structural components of the system to conduct heat to reduce temperature of the PV cell modules or to capture and use heat from the PV cell modules.

28. The concentrator system of claim 1, further comprising one or a plurality of heat conducting mechanisms to utilize the primary reflector or structural and extended structural components of the concentrator system as a heat sink to reduce temperature of the PV cell modules.

29. The concentrator system of claim 1, wherein the PV cell modules are disposed on the non-sun-collecting side of the primary reflectors such that in normal operation the PV cell modules are partially protected from dust or water and can be further protected by protective enclosures around the modules or the tertiary reflectors and their extensions around the PV cell modules.

30. The concentrator system of claim 1, wherein said PV cell modules are disposed between said sunray distributing optical mechanism and said primary reflectors.

* * * * *